(12) United States Patent
Mizutani

(10) Patent No.: US 10,923,263 B2
(45) Date of Patent: Feb. 16, 2021

(54) MAGNETIC CORE FIXING STRUCTURE

(71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventor: Yoshio Mizutani, Mie (JP)

(73) Assignees: AutoNetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 383 days.

(21) Appl. No.: 15/750,535

(22) PCT Filed: Jul. 20, 2016

(86) PCT No.: PCT/JP2016/071232
§ 371 (c)(1),
(2) Date: Feb. 6, 2018

(87) PCT Pub. No.: WO2017/026235
PCT Pub. Date: Feb. 16, 2017

(65) Prior Publication Data
US 2018/0233263 A1    Aug. 16, 2018

(30) Foreign Application Priority Data

Aug. 10, 2015  (JP) .................................. 2015-158157
May 24, 2016  (JP) .................................. 2016-103194

(51) Int. Cl.
*H01F 17/06* (2006.01)
*H02G 3/30* (2006.01)
(Continued)

(52) U.S. Cl.
CPC ............. *H01F 17/06* (2013.01); *H01F 27/24* (2013.01); *H02G 3/30* (2013.01); *H05K 9/0007* (2013.01)

(58) Field of Classification Search
CPC .......... H01F 17/06; H01F 27/02; H01F 27/26; H01F 27/263; H01F 2017/065; H05K 9/0007; H05K 9/0009; H02G 3/30
(Continued)

(56) References Cited

U.S. PATENT DOCUMENTS 5,243,127 A    9/1993  Kitagawa
8,902,036 B2  12/2014  Kawai
(Continued)

FOREIGN PATENT DOCUMENTS

JP    562166606 U    10/1987
JP    563112317 U     7/1988
(Continued)

OTHER PUBLICATIONS

Search Report for PCT/JP2016/071232, dated Sep. 27, 2016.

*Primary Examiner* — Tszfung J Chan
(74) *Attorney, Agent, or Firm* — Honigman LLP

(57) ABSTRACT

An aligned state of core sections is reliably maintained. A fixing structure for a cylindrical magnetic core including an insertion hole into which an electric wire is inserted with a plurality of core sections, which are divided in a circumferential direction, being coaxially aligned with each other, includes a clamping band to be wound around outer circumferential faces of the core sections to tighten the core sections. The magnetic core is accommodated in a holder, and the holder has a holder-side locking-receiving portion at which a remaining portion of the clamping band is locked.

(Continued)

Meanwhile, an electric wire fixing portion that is fixed to the electric wire, which passes through the magnetic core, is formed in the holder.

10 Claims, 28 Drawing Sheets

(51) Int. Cl.
*H01F 27/24* (2006.01)
*H05K 9/00* (2006.01)

(58) Field of Classification Search
USPC .................................................. 336/174, 175
See application file for complete search history.

(56) References Cited

U.S. PATENT DOCUMENTS

| | | | | |
|---|---|---|---|---|
| 2013/0222103 A1* | 8/2013 | Kawai | ..................... | H01F 27/02 336/175 |
| 2015/0008008 A1* | 1/2015 | Tanimizu | .............. | H01F 27/306 174/68.2 |
| 2017/0004903 A1* | 1/2017 | Suenaga | ............. | H01B 7/0045 |

FOREIGN PATENT DOCUMENTS

| | | |
|---|---|---|
| JP | H6164183 A | 6/1994 |
| JP | 2008-172265 A | 7/2008 |
| JP | 2014-096538 A | 5/2014 |

\* cited by examiner

MAGNETIC CORE FIXING STRUCTURE

CROSS-REFERENCE TO RELATED APPLICATIONS

This application is the U.S. national stage of PCT/JP2016/071232 filed Jul. 20, 2016, which claims priority of Japanese Patent Application No. JP 2016-103194 filed August May 24, 2016 and Japanese Patent Application No. JP 2015-1558157 filed Aug. 10, 2015.

TECHNICAL FIELD

The present invention relates to a magnetic core fixing structure.

BACKGROUND

There has conventionally been a demand for removal of high-frequency noise components caused by device operations such as switching from those electric conductors (such as electric wire or bus bars) through which a large current flows and connected to an electric device. As an example of measures therefor, a technique in which an electric conductor is passed through a central portion of a ferrite core (magnetic core), as described in JP 2014-82738A below, is known.

In this technique, the ferrite core is divided into two portions in its circumferential direction, and these portions are accommodated respectively in an upper case and a lower case. Both of these cases are configured to be connected to each other via a hinge in an openable and closable manner, and the electric conductor is set, with both cases being open, along a center groove of a divided ferrite core that is accommodated in one of the cases. Thereafter, a noise filter for the electric conductor is configured by closing the cases and locking them.

The core sections (divided cores) should not loosen within the case since they may then be unable to maintain an aligned state within the locked cases, and in order to maintain the original characteristics of the ferrite core. However, if the inner circumferential shape of the cases does not match the outer circumferential shape of the core sections due to play between the cases or a low molding accuracy of the core sections, there is a concern that the core sections do not come into sufficiently intimate contact with each other and loosen.

The present invention has been completed based on the foregoing situation, and aims for providing a magnetic core fixing structure that is able to reliably maintain the aligned state between the core sections.

SUMMARY

A magnetic core fixing structure according to the present invention is a magnetic core fixing structure for forming a tubular magnetic core having an insertion hole through which an electric conductor is passed along an axis, the magnetic core having a plurality of core sections, which are divided in a circumferential direction, aligned with each other, the magnetic core fixing structure comprising: a binding member that has a flexible band shape, and is wound, in the circumferential direction, around outer circumferential faces of the core sections to bind the core sections together, wherein one end portion of the binding member serves as a lock portion for maintaining a bound state between the divided cores, in a state where the divided cores are bound together, a portion of the other end portion of the binding member that has passed through the lock portion serves as a remaining portion, and the magnetic core is locked with the remaining portion to a locking-receiving portion that is provided in one of a fixing member and an enclosure capable of being fixed to the fixing member.

Advantageous Effects of Invention

According to the present invention, if the magnetic core is formed with a plurality of core sections, a magnetic core is obtained in which the core sections are aligned with each other by being tightly bound as a result of the binding member being wound therearound in the circumferential direction. The remaining portion that is formed when the binding member is wound around the magnetic core is directly locked to the locking-receiving portion that is provided in the fixing member to which the magnetic core is to be fixed, or is locked by the locking-receiving portion that is provided in an enclosure that is fixed to the fixing member. Thus, the magnetic core is fixed to the fixing member.

As described above, according to the present invention, the binding member is wound around the magnetic core around the entire circumference of the magnetic core, and thus, a binding force is applied substantially uniformly to the core sections. Accordingly, a magnetic core in which the core sections are maintained in an aligned state without loosening can be obtained.

DETAILED DESCRIPTION OF PREFERRED EMBODIMENTS

Figure 1:
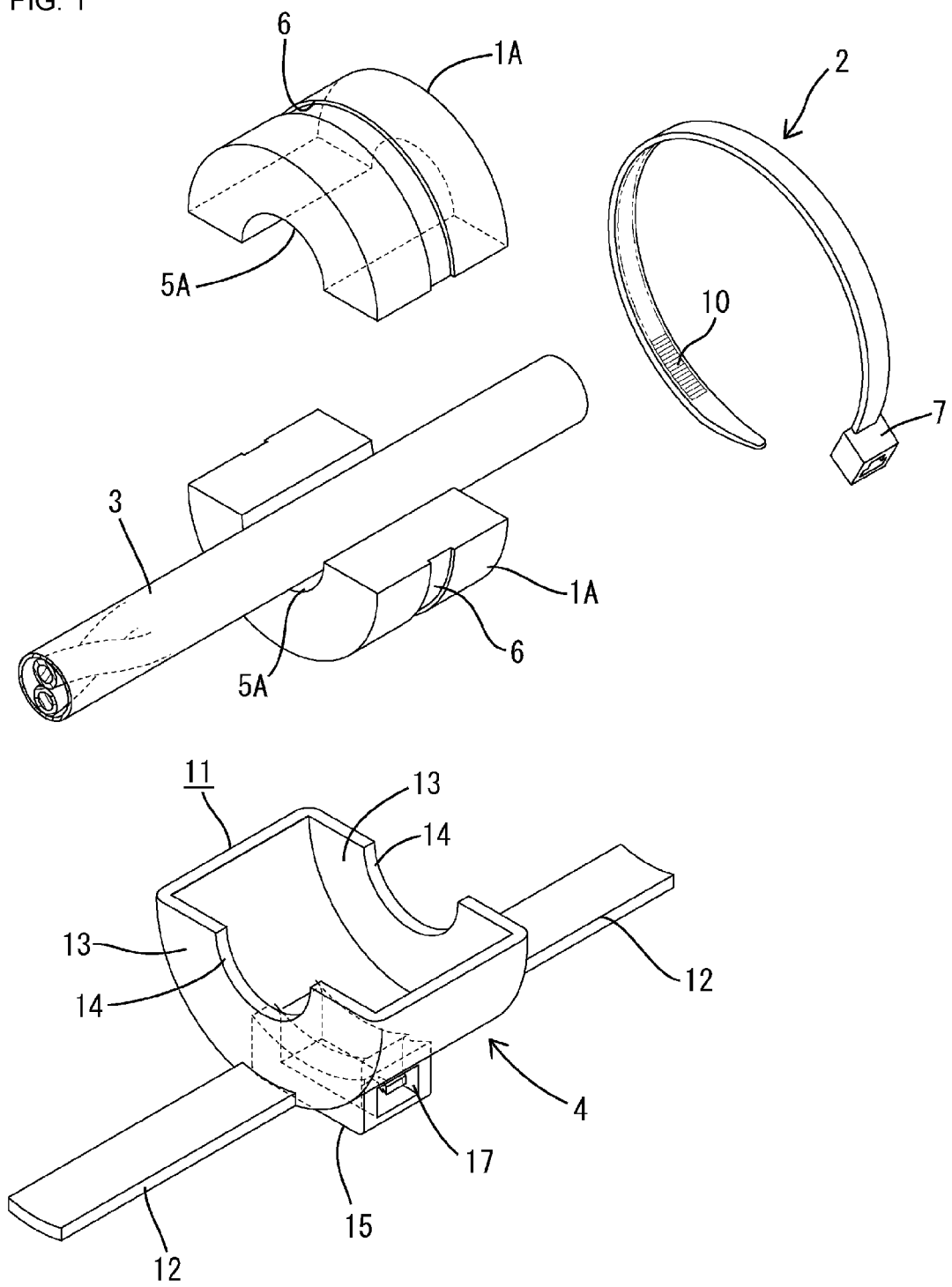
FIG. 1 is an exploded perspective view related to a magnetic core fixing structure according to Embodiment 1.

Preferable embodiments of the present invention will now be described.

(1) It is preferable that, in the magnetic core fixing structure according to the present invention according to claim 1, the remaining portion is locked to the locking-receiving portion provided in the enclosure, and the enclosure is fixed to the electric conductor, which serves as the fixing member.

With this configuration, the enclosure fixes the entire magnetic core using the electric conductor that passes through the magnetic core. Accordingly, the magnetic core can be fixed even if no appropriate fixing member is present around the magnetic core.

(2) In the magnetic core fixing structure according to claim 1, the remaining portion may be locked to the locking-receiving portion, which is provided on a vehicle body side, the vehicle body serving as the fixing member.

With this configuration, the remaining portion is locked on the immovable body side, and accordingly the fixed state of the magnetic core can be stabilized.

(3) In the magnetic core fixing structure according to claim 1, the remaining portion may be locked to the locking-receiving portion, which is provided in the enclosure, and the enclosure may be fixed to a wire harness, which serves as the fixing member and is arranged in a region near the electric conductor.

With this configuration, the enclosure is fixed to the wire harness that is arranged in the region near the electric conductor, i.e. the electric conductor and the wire harness are in a relationship in which they are held by each other via the magnetic core and the enclosure. Accordingly, this configuration also contributes to stabilization of the routing path of the wire harness and the electric conductor.

(4) In the magnetic core fixing structure according to claim 3, the remaining portion may be locked to a locking-receiving portion that is provided in the enclosure, and an end portion of the remaining portion may penetrate the enclosure and be led out toward a locking-receiving portion that is provided on the body side.

The remaining portion is locked to the locking-receiving portion provided in the enclosure, is then passed through the enclosure and led out toward the locking-receiving portion provided on the body side, and is locked on the body side. Thus, similarly to (2), the fixed state of the magnetic core can be stabilized.

(5) In the magnetic core fixing structure according to claim 2, the enclosure may include a core attaching portion that has the locking-receiving portion and exposes the entire magnetic core, and electric conductor fixing portions that extend from both end portions of the core attaching portion in a direction in which the electric conductor extends, the electric conductor fixing portions being fixed to the electric conductor.

With this configuration, in the enclosure, the electric conductor fixing portions are configured to extend in the direction in which the electric conductor extends, with the core attaching portion therebetween, i.e. a gap between portions fixed to the electric conductor can be made to be long. Accordingly, the magnetic core can be stably attached.

(6) In the magnetic core fixing structure according to claim 4, the enclosure may have the locking-receiving portion and include a core attaching portion that exposes the entire magnetic core, and harness fixing portions that extend from both end portions of the core attaching portion in a direction in which the wire harness extends, the harness fixing portions being fixed to the wire harness.

With this configuration, in the enclosure, the harness fixing portions are configured to extend in the direction in which the electric conductor extends, with the core attaching portion therebetween, i.e. a gap between portions fixed to the wire harness can be made to be long. Accordingly, the magnetic core can be stably attached.

(7) In the magnetic core fixing structure according to claim 2, the enclosure may have the locking-receiving portion and have a case shape that substantially matches an outer circumferential shape of the magnetic core, accommodates substantially half of the circumference thereof, and exposes the remaining, substantially half of the circumference thereof, the enclosure being provided with: a core accommodating portion in which a pair of pressing walls are formed at both ends in an axial direction that oppose respective end faces, in the axial direction, of the magnetic core and position the magnetic core relative to the axial direction, and electric conductor fixing portions that extend from both end portions of the core accommodating portion in an axial direction of the electric conductor and are fixed to the electric conductor.

This configuration can not only exhibit the effect of (5), but can also stabilize the posture of the magnetic core when being accommodated since, in the enclosure, the core accommodating portion is formed so as to match the outer circumferential shape of the magnetic core. In addition, since the core accommodating portion has the pair of pressing walls to position the magnetic core relative to the axial direction, the magnetic core can be accommodated in a state where its loosening in the axial direction is also restricted.

(8) In the magnetic core fixing structure according to claim 4, the enclosure may have the locking-receiving portion and have a case shape that substantially matches an outer circumferential shape of the magnetic core, accommodates substantially half of the circumference thereof, and exposes the remaining, substantially half of the circumference thereof, the enclosure being provided with: a core accommodating portion in which a pair of pressing walls are formed at both ends in an axial direction that oppose respective end faces, in the axial direction, of the magnetic core and position the magnetic core relative to the axial direction, and harness fixing portions that extend from both end portions of the core accommodating portion in an axial direction of the wire harness and are fixed to the wire harness.

This configuration can achieve the effects of (6) and (7).

(9) In the magnetic core fixing structure according to claim 5, the enclosure may have the locking-receiving portion and have a case shape that substantially matches an outer circumferential shape of the magnetic core, accommodates substantially half of the circumference thereof, and exposes the remaining, substantially half of the circumference thereof, the enclosure being provided with: a core accommodating portion in which a pair of pressing walls are formed at both ends in an axial direction that oppose respective end faces, in the axial direction, of the magnetic core and position the magnetic core relative to the axial direction, and a lead-out hole for leading out the remaining portion toward the locking-receiving portion provided on the body side.

This configuration can achieve the effects of (4) and (7).

(10) In the magnetic core fixing structure according to claim 2, the enclosure may have the locking-receiving portion and have a case shape that accommodates the entire magnetic core in a hidden state using a pair of openable and closable half-divided bodies that substantially match an outer circumferential shape of the magnetic core and are divided in a radial direction, the enclosure being provided with: a core accommodating portion having a pair of pressing walls that are formed in the half-divided bodies and oppose respective end faces, in the axial direction, of the magnetic core and position the magnetic core relative to the axial direction, and electric conductor fixing portions that extend from both end portions of the core accommodating portion in an axial direction of the electric conductor and are fixed to the electric conductor.

With this configuration, the enclosure accommodates the magnetic core in a state of hiding the entirety thereof, and accordingly the magnetic core can be protected from cracking or chipping due to interference with a foreign substance.

(11) In the magnetic core fixing structure according to claim 4, the enclosure may have the locking-receiving portion and have a case shape that accommodates the entire magnetic core in a hidden state using a pair of openable and closable half-divided bodies that substantially match an outer circumferential shape of the magnetic material core and are divided in a radial direction, the enclosure being provided with: a core accommodating portion having a pair of pressing walls that are formed in the half-divided bodies and oppose respective end faces, in the axial direction, of the magnetic core and position the magnetic core relative to the axial direction, and harness fixing portions that extend from both end portions of the core accommodating portion in an axial direction of the wire harness and are fixed to the wire harness.

This configuration can achieve the effects of (6) and (10).

(12) In the magnetic core fixing structure according to claim 5, the enclosure may have the locking-receiving portion and have a case shape that accommodates the entire magnetic core in a hidden state using a pair of openable and closable half-divided bodies that substantially match an outer circumferential shape of the magnetic material core and are divided in a radial direction, the enclosure being provided with: a core accommodating portion having a pair of pressing walls that are formed in the half-divided bodies and oppose respective end faces, in the axial direction, of the magnetic core and position the magnetic core relative to the axial direction, and a lead-out hole for leading out the remaining portion toward the locking-receiving portion provided on the body side.

This configuration can achieve the effects of (9) and (10).

In the magnetic core fixing structure according to any of the aspects described above, a positioning portion for positioning the binding member relative to an axial direction of the magnetic core may be formed in an outer circumferential face of the magnetic core.

With this configuration, when the binding member is wound around the core sections, the binding member is positioned in the axial direction by the positioning portion. Accordingly, the magnetic core with the core sections that are reliably aligned with each other can be obtained.

In the magnetic core fixing structure according to any of the aspects described above, the binding member may be made of a material having a higher heat conductivity than that of the magnetic core, and the enclosure may be connected to a heat-releasing member, or the remaining portion may be connected to the heat-releasing member via a heat-transmitting member.

With this configuration, heat that is generated from the magnetic core and heat that is generated from the electric conductor that passes through the magnetic core and is transmitted to the magnetic core can be released from the heat-releasing member via the enclosure, or can be released from the heat-releasing member via the binding member and the heat-transmitting member. As a result, an increase in the temperature of the magnetic core is suppressed, and a filtering function can be prevented from deteriorating.

Next, embodiments of the magnetic core fixing structure according to the present invention will be described with reference to the drawings.

Embodiment 1

Figure 2:
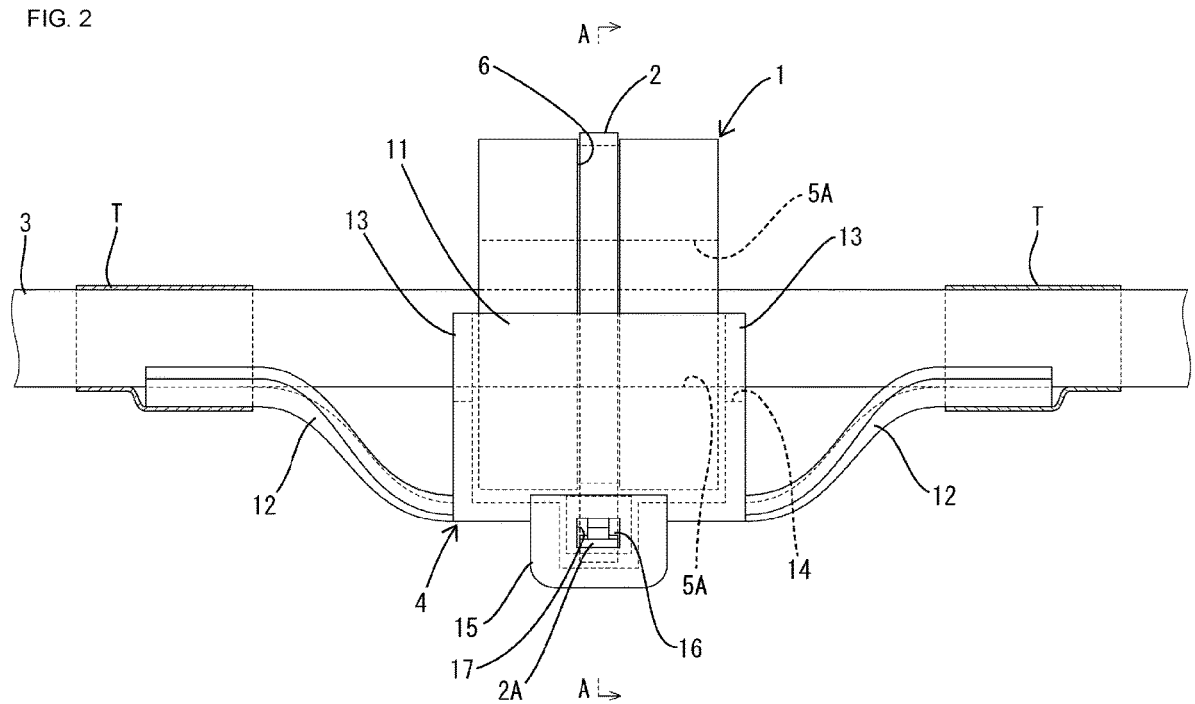
FIG. 2 is a front elevational view related to the same.
Figure 3:
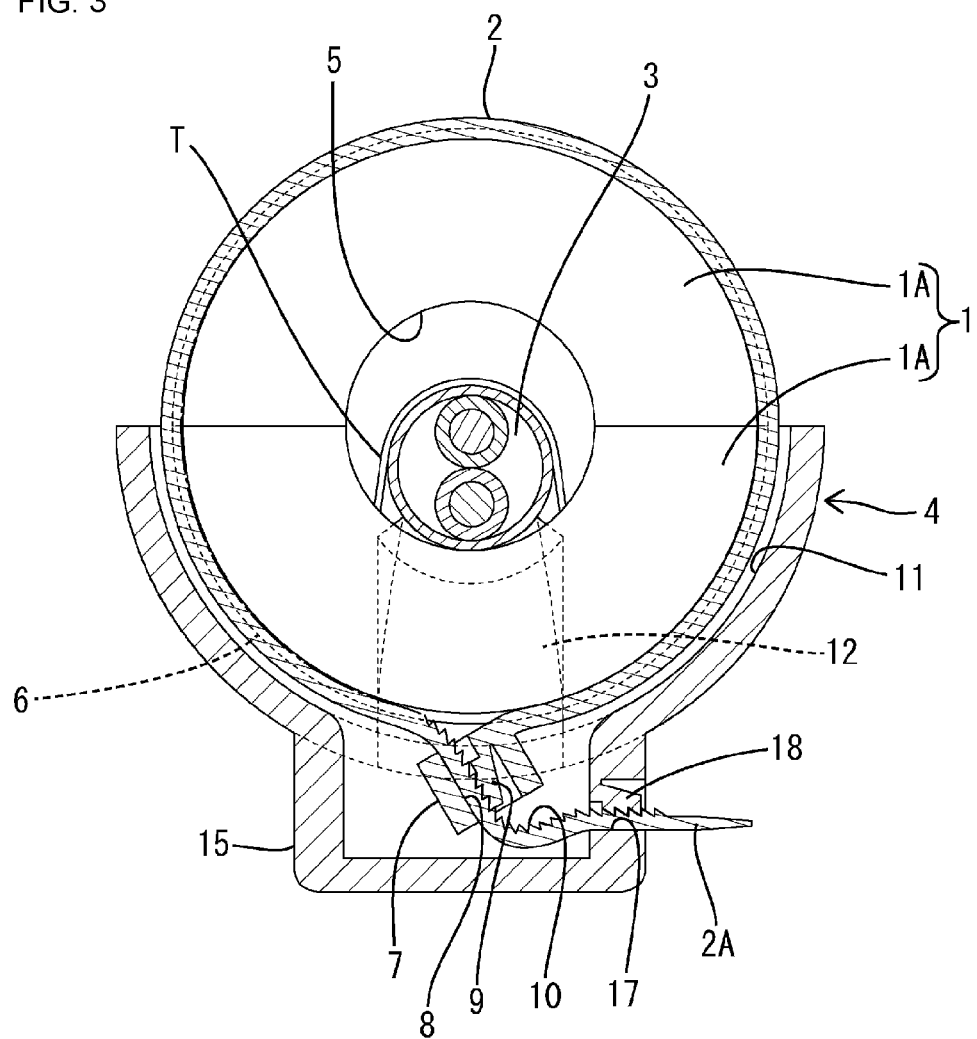
FIG. 3 is a cross-sectional view taken along a line A-A in FIG. 2.

FIGS. 1 to 3 show Embodiment 1 of the present invention. A fixing structure for a magnetic core 1 according to Embodiment 1 includes the magnetic core 1, an electric wire 3 (electric conductor), which passes through the central axis of the magnetic core 1, a clamping band 2 (binding member) for tightening core sections 1A, which constitute the magnetic core 1, and a holder 4 (enclosure), which accommodates the magnetic core 1 and enables the magnetic core 1 to be fixed to the electric wire 3.

As shown in FIG. 1, the magnetic core 1 (ferrite core) is equally divided into two portions in its circumferential direction. When divided faces of both core sections 1A are caused to face each other in an aligned state, a cylindrical shape is formed as a whole. Recessed grooves 5A are formed along an axial direction on the divided faces of the core sections 1A. When the magnetic core 1 is formed so that the recessed grooves 5A are aligned with each other, an electric wire insertion hole 5 (insertion hole) is formed along the axis, and an electric wire 3 can be passed through (inserted into) this electric wire insertion hole 5.

A positioning groove 6 (positioning portion) is provided in a recessed manner, extending in the circumferential direction over the entire circumference, in an intermediate portion, with respect to the axial direction, of an outer circumferential face of the magnetic core 1. This positioning groove 6 is for positioning the clamping band 2, which will be described next, to keep it from shifting relative to the axial direction. The positioning groove 6 has a groove width that allows the clamping band 2 to be fitted thereto to substantially come into intimate contact, and is formed to have a depth with which a shift of the clamping band 2 in the axial direction can be effectively suppressed (in this example, the positioning groove 6 is formed so as to be slightly shallower than the thickness of the clamping band 2).

One end of the electric wire 3 is connected to an input device (not shown), and the other end side is connected to an output device (not shown), for example. An intermediate portion of the electric wire 3 passes through the electric wire insertion hole 5 of the magnetic core 1 in its axial direction.

The clamping band 2 is made in one piece of a synthetic resin material. The clamping band 2 has an elongated band shape, has good flexibility as a whole, and can be wound around the outer circumferential face (positioning groove) of the magnetic core 1 in intimate contact therewith, over the entire circumference. The clamping band 2 is formed so as to be sufficiently longer than the entire circumferential length of the magnetic core 1, and is accordingly formed to have a length with which a remaining portion 2A is formed on one end side of the clamping band 2, when it is wound over the entire circumference.

A lock portion 7 for maintaining a bound state is provided at a first end portion of the clamping band 2. The lock portion 7 has a box shape, and an insertion path 8 for allowing a second end portion of the clamping band 2 to be inserted therethrough is formed within the lock portion 7, as shown in FIG. 3. Within the lock portion 7, a locking claw 9 is formed in the insertion path 8. The locking claw 9 is formed in a cantilevered manner and is bendable toward the direction in which the second end portion of the clamping band 2 is inserted. On the other hand, a plurality of locking teeth 10 are provided on the face on one side of the second end portion of the clamping band 2 (the side facing the locking claw 9 when the clamping band 2 is inserted into the insertion path 8), forming a saw blade shape in their cross section. As shown in FIG. 3, the locking teeth 10 are formed at a uniform pitch over a predetermined length from a position that is slightly spaced apart from the second end of the clamping band 2. The locking position between the locking teeth 10 and the locking claw 9 can be changed in the direction in which the clamping band 2 is inserted into the lock portion 7 while sequentially moving over the locking teeth 10, but is locked in the opposite direction in a self-locking state. That is to say, by inserting the second end portion of the clamping band 2 into the lock portion 7 and pulling up the remaining portion 2A (the portion of the clamping band 2 that has passed through the lock portion 7), the locking claw is locked to a specific locking tooth 10 in a self-locking state, thereby tightening the core sections 1A in an aligned state.

The holder 4 in this example is made in one piece of a synthetic resin material. As shown in FIG. 1, the holder 4 includes a core accommodating portion 11 for accommodating substantially half the circumference of the magnetic core 1, and electric wire fixing portions 12 (electric conductor fixing portions) for fixing the holder 4 to the electric wire 3.

The core accommodating portion 11 has a shape obtained by cutting a cylindrical member along a plane including its central axis, and is open on one face side to allow the magnetic core 1 to be accommodated. An inner circumferential face (bottom face in FIG. 1) of the core accommodating portion 11 has a semi-circular shape that matches the shape of the outer circumferential face of the magnetic core 1.

A pair of pressing walls 13 are formed at both ends, in the axial direction, of the core accommodating portion. As shown in FIG. 2, when the magnetic core 1 is accommodated in the core accommodating portion 11, both pressing walls 13 face the respective end faces, in the axial direction, of the magnetic core 1 substantially without a gap, so that the magnetic core 1 does not shift in the axial direction within the holder 4. A recess portion 14 for avoiding interference with the electric wire 3 when the magnetic core 1 is accommodated in the holder 4 is formed by cutting out a central portion of an end edge (in the diagram) of each pressing wall 13.

As shown in FIG. 3, a protruding portion 15 protrudes from a bottom face of the holder 4. The protruding portion 15 is formed in a hollow shape that is in communication with an internal space of the main body of the holder 4, and can accommodate the lock portion 7 and part of the remaining portion 2A of the clamping band 2 when the clamping band 2 tightens the magnetic core 1. A holder-side locking-receiving portion 16 is formed in one side face of the protruding portion 15.

An insertion hole 17, into which the remaining portion 2A of the clamping band 2 can be inserted, penetrates the holder-side locking-receiving portion 16. A holder-side locking claw 18, which is similar to the lock portion 7 of the clamping band 2, is formed in the insertion hole 17, and can be selectively locked with the locking teeth 10. The leading end side of the remaining portion 2A is led to the outside of the holder 4 through the insertion hole 17. Accordingly, when a portion of the remaining portion 2A that has been led to the outside of the holder 4 is strongly pulled, the corresponding holder-side locking claw 18 and the locking teeth 10 are locked with each other. Thus, the magnetic core 1 can be pressed against the bottom face of the holder 4 (core accommodating portion 11) so that the magnetic core 1 does not loosen within the holder 4.

A pair of electric wire fixing portions 12 extend in the axial direction from respective end portions, in the axial direction, of the holder 4. Specifically, the pair of electric wire fixing portions 12 extend in a cantilevered manner, outward in the axial direction from the center of end portions of the respective pressing walls 13 on the side opposite to the recess portions 14. The electric wire fixing portions 12 in this example are flexible, and extend straight in their natural state, whereas, when the electric wire fixing portions 12 are fixed to the electric wire 3 by winding a tape therearound, the electric wire fixing portions 12 are deformed and bent on their free end side from an intermediate portion toward the electric wire 3 side, as shown in FIG. 2. Note that the free end side is configured to form a cross-sectional shape that is curved in accordance with the outer circumferential shape of the electric wire 3.

Next, effects of Embodiment 1 with the above-described configuration will be described. First, a description will be given of an example of a procedure for assembling the fixing structure for the magnetic core 1 in this example.

Initially, as shown in FIG. 1, an intermediate portion of the electric wire 3 is fitted into the recessed groove 5A of one of the core sections 1A, extending therealong. Subsequently, the divided face of one core section 1A is abutted against the divided face of the other core section 1A so that the divided faces of both core sections 1A are aligned with each other. The electric wire 3 is thus enclosed by both recessed grooves 5A, and is, as a result, inserted into the electric wire insertion hole 5 of the magnetic core 1.

In this state, an operation of tightening up the magnetic core 1 with the clamping band 2 is performed. During this operation, the clamping band 2 is arranged along the positioning groove 6 throughout the entire circumference, thereby avoiding the clamping band 2 from being obliquely attached to the magnetic core 1 or from being attached thereto while being shifted toward an end side of the magnetic core 1. An end portion of the clamping band 2 on the locking teeth 10 side is inserted into the insertion path 8 in the lock portion 7, and a specific locking tooth 10 and the locking claw 9 are locked with each other in a self-locking state when the remaining portion 2A is pulled until the remaining portion 2A enters a state of being unable to be pulled anymore, i.e. a state where the divided faces of both core sections 1A are aligned with and press-fitted to each other. The core sections 1A are thus directly tightened to each other by the clamping band 2, and a uniform tightening force can be applied thereto over their entire circumference. Accordingly, in the magnetic core 1, both core sections 1A are maintained in an aligned state without loosening, i.e. without shifting in the axial direction or separating in the radial direction.

Thereafter, the magnetic core 1 is accommodated in the holder 4 so that the lock portion 7 of the clamping band 2 faces downward. At this time, a portion of the electric wire 3 enters both recess portions 14, thereby avoiding interference with the holder 4. The end portion of the clamping band 2 on the remaining portion 2A side is led to the outside of the holder 4 via the insertion hole 17 in the holder-side locking-receiving portion 16, and the lock portion 7 is accommodated in the protruding portion 15. The portion of the remaining portion 2A that has been led to the outside of the holder 4 is strongly pulled, and the holder-side locking claw 18 of the holder-side locking-receiving portion 16 and a specific locking tooth 10 are locked with each other in a self-locking state when the outer circumferential face of the magnetic core 1 is press-fitted to the inner circumferential face of the holder 4 (core accommodating portion 11) and the remaining portion 2A cannot be pulled anymore.

Lastly, the free end portions of both electric wire fixing portions 12 are bent toward the electric wire 3 side to be arranged along the electric wire 3, and are fixed thereto by winding a tape T therearound. Thus, the entire magnetic core 1 with the holder is fixed relative to the axial direction.

Since the magnetic core 1 is tightened with the tightening force uniformly applied thereto from the entire circumference by the clamping band 2, both core sections 1A do not shift in the axial direction or separate in the radial direction, thereby avoiding loosening. Thus, the loosening of the magnetic core 1 is reliably avoided.

As for the holder 4 as well, the magnetic core 1 can be accommodated therein in a state where loosening thereof within the holder 4 is suppressed, by locking the remaining portion 2A with the holder-side locking-receiving portion 16 in a self-locking state.

Particularly, this example, in which the magnetic core 1 and the holder 4 are fixed to each other using the electric wire 3, which is subjected to noise reduction, is effective when no member suitable for fixing the magnetic core 1 is present around.

Furthermore, in Embodiment 1, a pair of electric wire fixing portions 12 extend in the axial direction with the core accommodating portion 11 therebetween. Thus, a long gap can be formed between the portions of the electric wire fixing portions 12 that are fixed to the electric wire 3, and accordingly, an effect of stabilizing the state of the holder 4 attached to the electric wire 3 can also be achieved.

Embodiment 2

Figure 4:
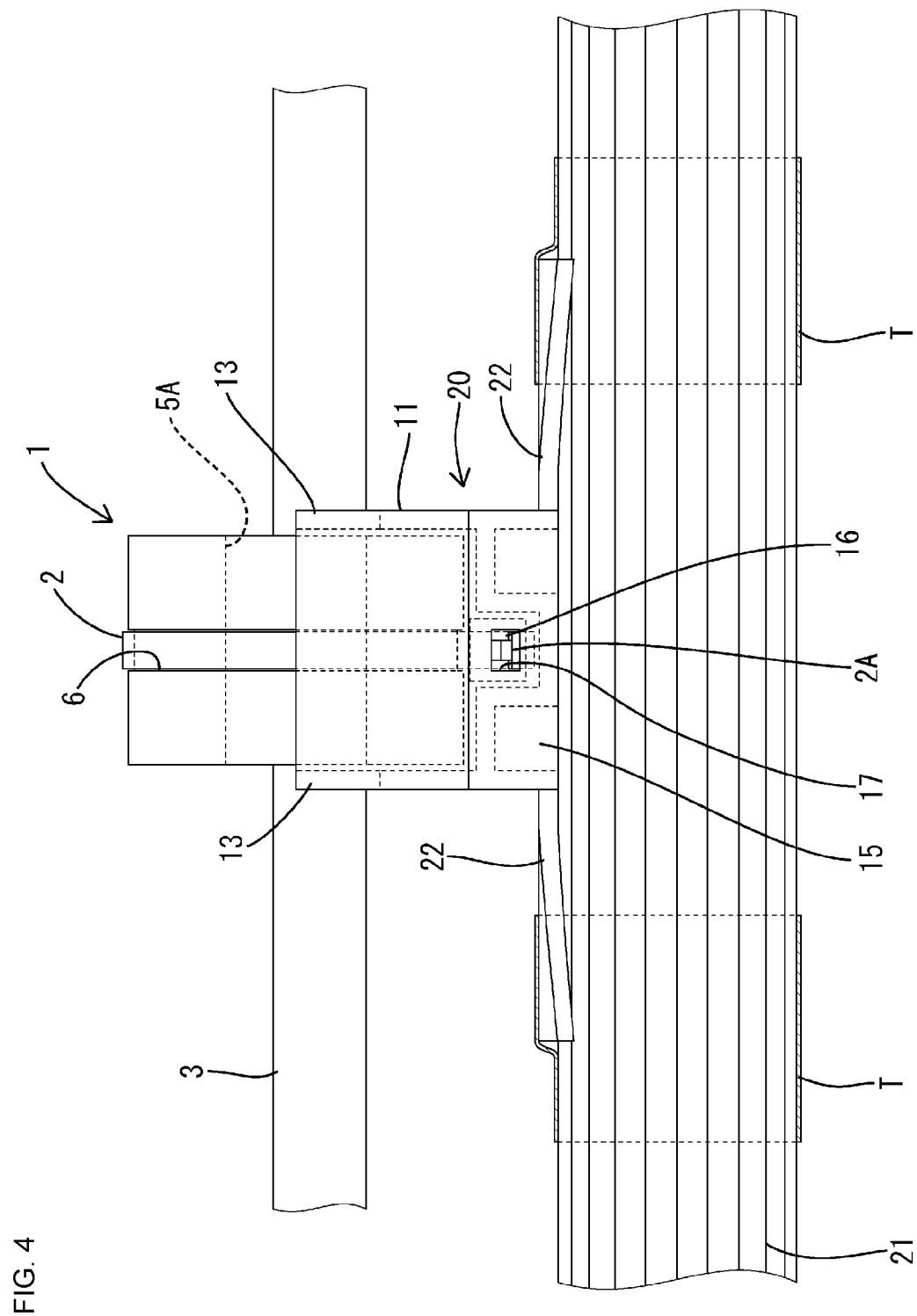
FIG. 4 is a front elevational view according to Embodiment 2.

FIG. 4 shows Embodiment 2 of the present invention. In Embodiment 1, the electric wire 3 is selected as a target to which the magnetic core 1 and the holder 4 are attached, whereas, in Embodiment 2, a wire harness 21, which is arranged substantially parallel to the electric wire 3, is selected thereas. Of the members constituting the fixing structure, the magnetic core 1, the clamping band 2, and the electric wire 3 have the same configuration as those in Embodiment 1.

Also harness fixing portions 22 of a holder 20 have substantially the same configuration as the electric wire fixing portions in Embodiment 1, although only their name differs from Embodiment 1 due to the harness fixing portions 22 being fixed to the wire harness 21. The protruding portion 15 in this example is formed to have the same width as that of the core accommodating portion 11 in the axial direction. When the protruding portion 15 is fixed to the wire harness 21, the entire lower face of the protruding portion 15 is brought into contact with the wire harness in the axial direction. In Embodiment 1, when both electric wire fixing portions 12 of the holder 4 are fixed to the electric wire 3, the electric wire fixing portions 12 are deformed and curved so as to be brought close to the electric wire 3. In contrast, the harness fixing portions 22 according to Embodiment 2 are used substantially in their originally molded state, i.e. extending in the axial direction.

Note that structures having the same functionality as those in Embodiment 1 are assigned the same reference numerals, and their description is omitted.

According to Embodiment 2 with the above-described configuration, an effect of contributing to stabilization of a routing path of the harness and the electric wire 3 can also be achieved in addition to the effects of Embodiment 1, since fixing portions are formed at intermediate portions of the wire harness 21, as well as the magnetic core 1 itself is fixed.

Embodiment 3

Figure 5:
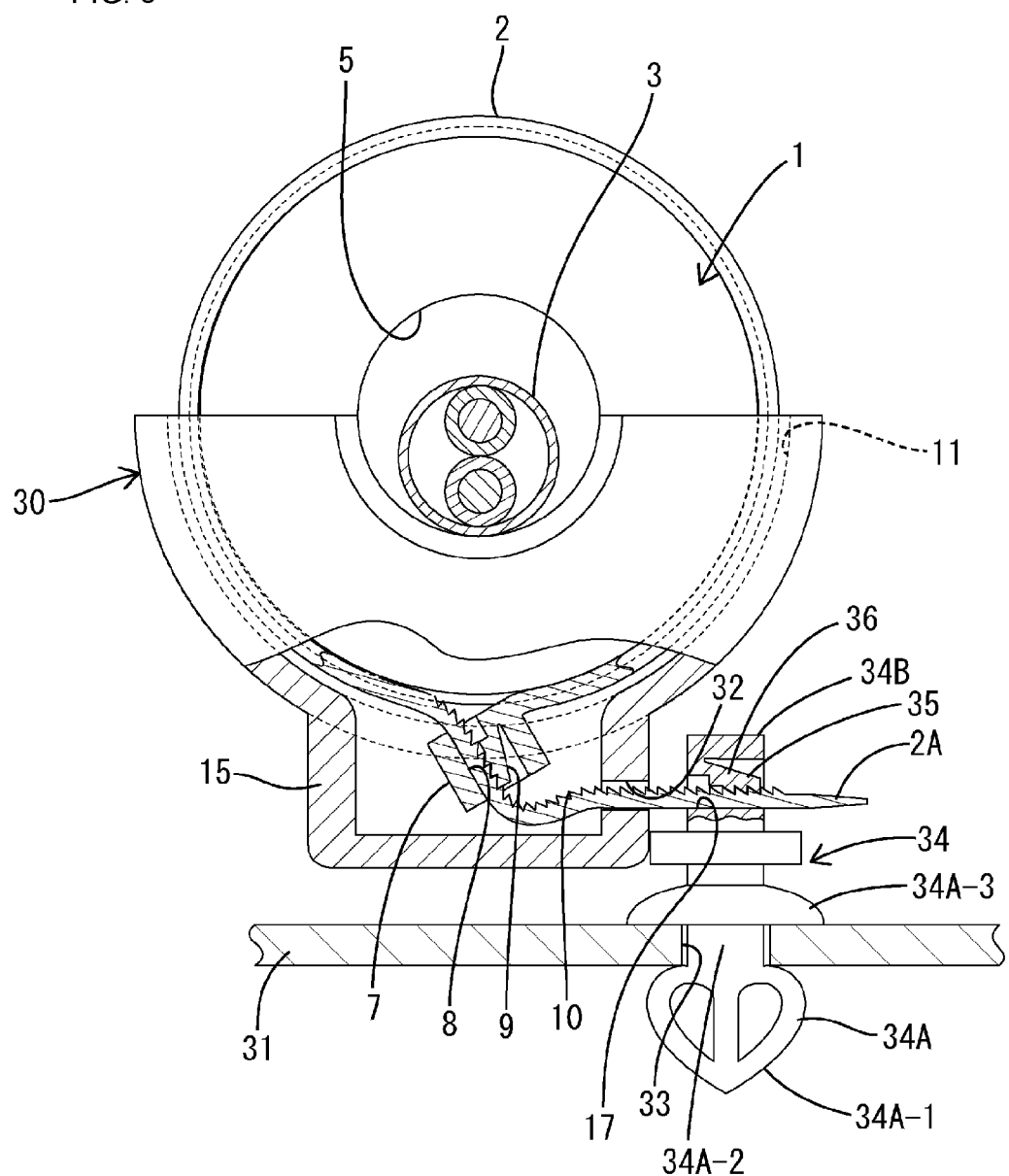
FIG. 5 is a partial breakaway view of a fixing structure according to Embodiment 3 as viewed from the side.

FIG. 5 shows Embodiment 3 of the present invention. In Embodiment 3, a body 31 of an automobile is selected as a portion to which a holder 30 is fixed. The configuration of the magnetic core 1, the clamping band 2, and the electric wire 3 is the same as that in Embodiment 1 and Embodiment 2. The holder 30 differs only in that the electric wire fixing portions 12 or the harness fixing portions 22 and the holder-side locking-receiving portion 16 are not provided, and a lead-out hole 32, through which the remaining portion 2A is simply passed through, penetrates in place of the holder-side locking-receiving portion 16. Other structures are the same as those of Embodiments 1 and 2.

In Embodiment 3, an attachment hole 33 penetrates the body 31, and a clip 34 is attached here. The clip 34 is made of a synthetic resin, and is constituted by an inserting portion 34A that is inserted into the attachment hole 33, and an attachment portion 34B that is made in one piece above the inserting portion 34A and has a body-side locking-receiving portion 35.

The inserting portion 34A has a self-locking piece 34A-1 that deforms so as to narrow in the radial direction when the inserting portion 34A is inserted into the attachment hole 33, and restores in an expanding direction after the inserting portion 34A has passed through the attachment hole 33 so that the clip 34 cannot be pulled out of the attachment hole 33, and is thus elastically locked relative to the hole edge, a joint shaft portion 34A-2 that is continuous with the self-locking piece 34A-1 on the central axis of the clip 34 and is inserted into the attachment hole 33, and a sealing piece 34A-3 that is continuous with an upper portion of the joint shaft portion 34A-2. The sealing piece 34A-3 is formed in an umbrella shape having a larger diameter than the attachment hole 33. When the clip 34 is attached to the body 31, the outer circumferential edge of the sealing piece 34A-3 comes into intimate contact, in a sealing state, with the periphery of the attachment hole 33 in the body 31, and thus prevents the attachment hole 33 from being exposed to water or dust.

The attachment portion 34B is continuous with an upper portion of the sealing piece 34A-3. The body-side locking-receiving portion 35 is formed in an upper end portion of the clip 34. The body-side locking-receiving portion 35 has basically the same configuration as that of the holder-sider locking-receiving portion 16 in Embodiments 1 and 2, and the remaining portion 2A of the clamping band 2 can be locked with a clip-side locking claw 36 in a self-locking state.

In Embodiment 3 with the above-described configuration, the clip 34 is attached, in advance, to the attachment hole 33 in the body 31. On the other hand, the magnetic core 1 tightened by the clamping band 2 is accommodated in the holder 30, and the remaining portion 2A is led out through the lead-out hole 32 in the holder 30. The portion of the remaining portion 2A that has been led out from the holder 30 is pulled outward in a state of having passed through the body-side locking-receiving portion 35 of the clip 34. Thus, similar to Embodiments 1 and 2, the magnetic core 1 is fixed within the holder 30 without loosening, and is also fixed the body 31 as a whole.

As described above, according to Embodiment 3, the magnetic core 1 and the holder 30 are fixed to the body 31, which is immovable. Accordingly, the fixed state of the magnetic core 1 and the holder 30 can be made more stable than in Embodiments 1 and 2.

Embodiment 4

Figure 6:
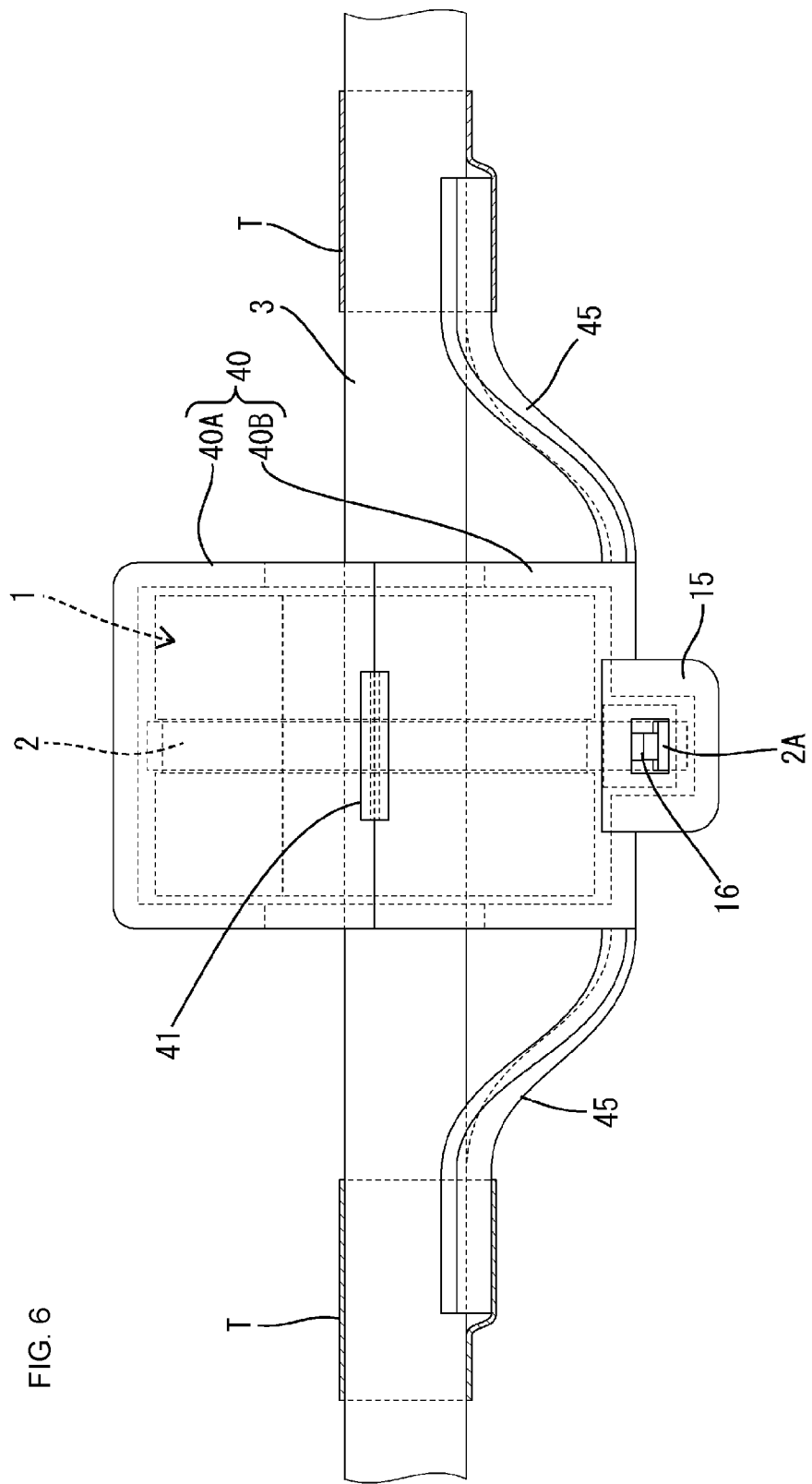
FIG. 6 is a front elevational view according to Embodiment 4.
Figure 7:
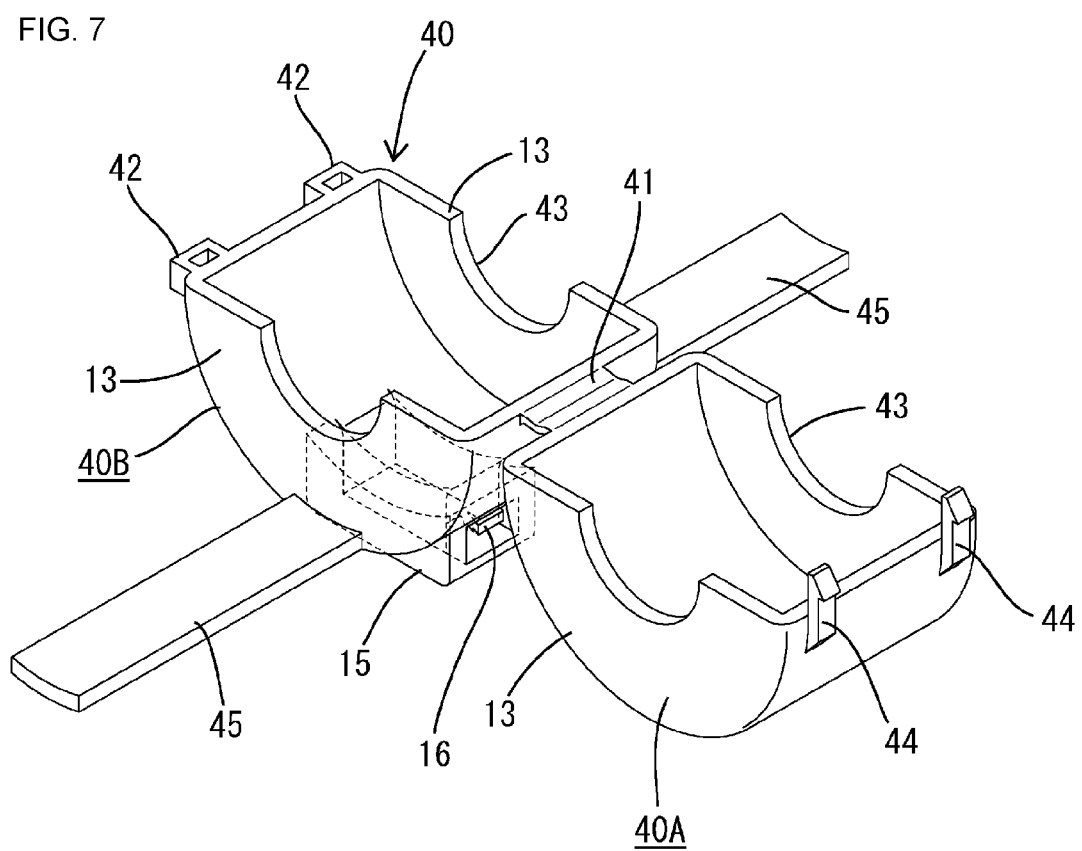
FIG. 7 is a perspective view showing an open state of an upper holder and a lower holder according to the same.

FIGS. 6 and 7 show Embodiment 4 of the present invention. In Embodiments 1 to 3, the holders 4, 20, and 30 are configured to accommodate the lower half of the magnetic core 1, and the upper half thereof is exposed (protrudes) from the holders 4, 20, and 30. Meanwhile, a holder 40 according to Embodiment 4 is configured to accommodate the entire magnetic core 1 so that the entirety thereof is hidden.

As shown in FIG. 7, the holder 40 according to Embodiment 4 includes an upper holder 40A and a lower holder 40B (each of which constitutes a half-divided body according to the present invention), which are connected to each other in an openable and closable manner via a hinge 41. The basic configuration of the lower holder 40B is the same as that in Embodiments 1 and 2. However, a pair of receiving portions 42 are formed at an opening edge of the lower holder 40B on a side opposite to the hinge 41. Both receiving portions 42 are formed in a square tubular shape that is open in an up-down direction in the diagram.

The upper holder 40A can accommodate the upper half circumference of the magnetic core 1, and its inner face is formed so as to match the outer circumferential face of the magnetic core 1, similarly to the lower holder 40B. In a state where both holders 40A and 40B are closed, the opening edge of the upper holder 40A is aligned with the opening edge of the lower holder 40B, and recess portions 43 formed in both holders 40A and 40B are also aligned with each other.

A pair of locking claws 44 are provided in the opening edge of the upper holder 40A on a side opposite to the hinge 41, and their leading end portions protrude upward from the opening edge. When the upper and lower holders 40A and 40B are closed, both locking claws 44 are inserted into and locked to the corresponding receiving portions 42, and the holders 40A and 40B are thus locked in a closed state. In addition, in Embodiment 4, the magnetic core 1 and both holders 40A and 40B are fixed by winding the tape T around electric wire fixing portions 45 together with the electric wire 3, similarly to Embodiment 1.

In this embodiment, since the magnetic core 1 is accommodated in a state where the entirety thereof is hidden, it is possible to achieve an effect of protecting the magnetic core 1 from cracking or chipping due to interference with other components, in addition to the effects of the Embodiment 1.

Embodiment 5

Figure 8:
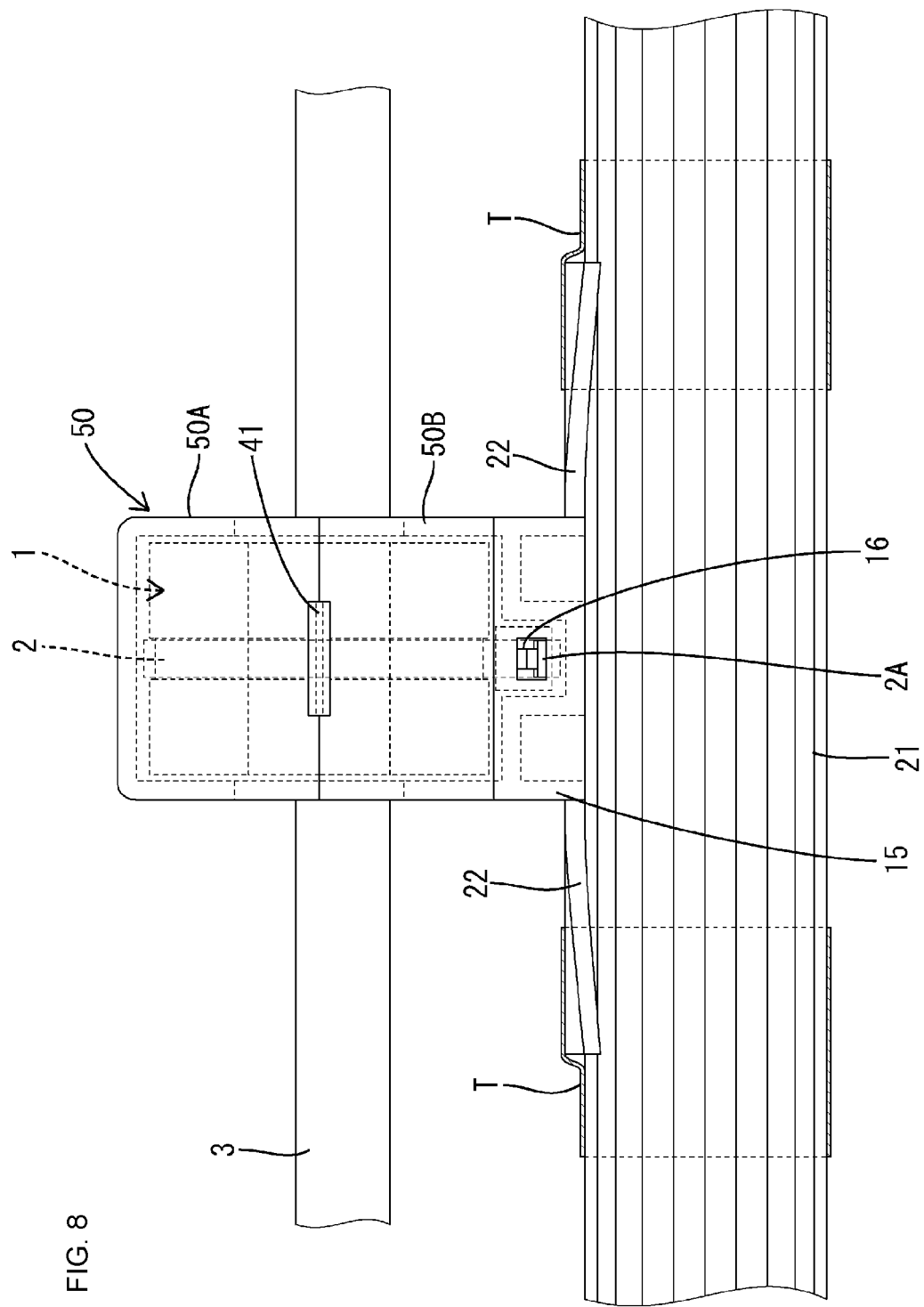
FIG. 8 is a front elevational view according to Embodiment 5.

FIG. 8 shows Embodiment 5 of the present invention. In this embodiment, the fixing member in Embodiment 4 is replaced with a wire harness 21 that is arranged parallel to the electric wire 3. It can also be said that the holder 20 in Embodiment 2 is replaced with the holder 40 in Embodiment 4. Accordingly, the holder 50 in this example is also constituted by an upper holder 50A and a lower holder 50B in an openable and closable manner.

Other structures are the same as those of Embodiment 4, and accordingly, the same effects can be achieved. Furthermore, the tape T is wound around the holder 50 together with the wire harness 21 at intermediate portions thereof, similarly to Embodiment 2. This configuration contributes to stabilization of a routing path of the wire harness 21 and the electric wire 3.

Embodiment 6

Figure 9:
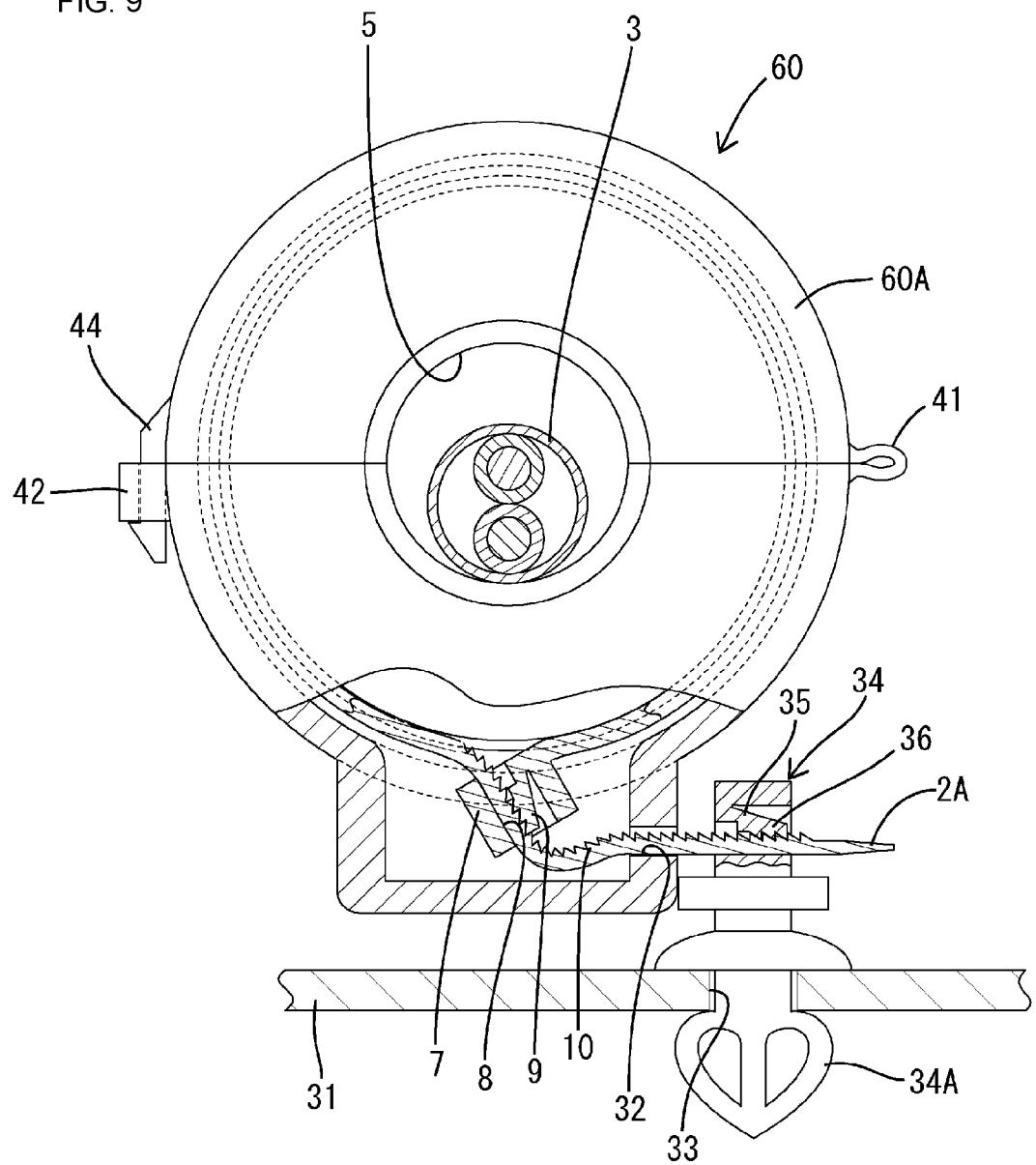
FIG. 9 is a partial breakaway view of a fixing structure according to Embodiment 6 as viewed from the side.

FIG. 9 shows Embodiment 6 of the present invention. In this embodiment, the fixing member in Embodiment 5 is replaced with a body (clip), and it can also be said that the holder 30 in Embodiment 3 is replaced with the holder 40 or 50 in Embodiment 4 or 5.

Other structures are the same as those of Embodiments 4 and 5, and accordingly, the same effects can be achieved. In addition, since the magnetic core 1 and a holder 60 are fixed to an immovable body via the clip, the fixed state of the magnetic core 1 and the holder 60 can be made more stable than that in Embodiments 1 and 2.

Embodiment 7

Figure 10:
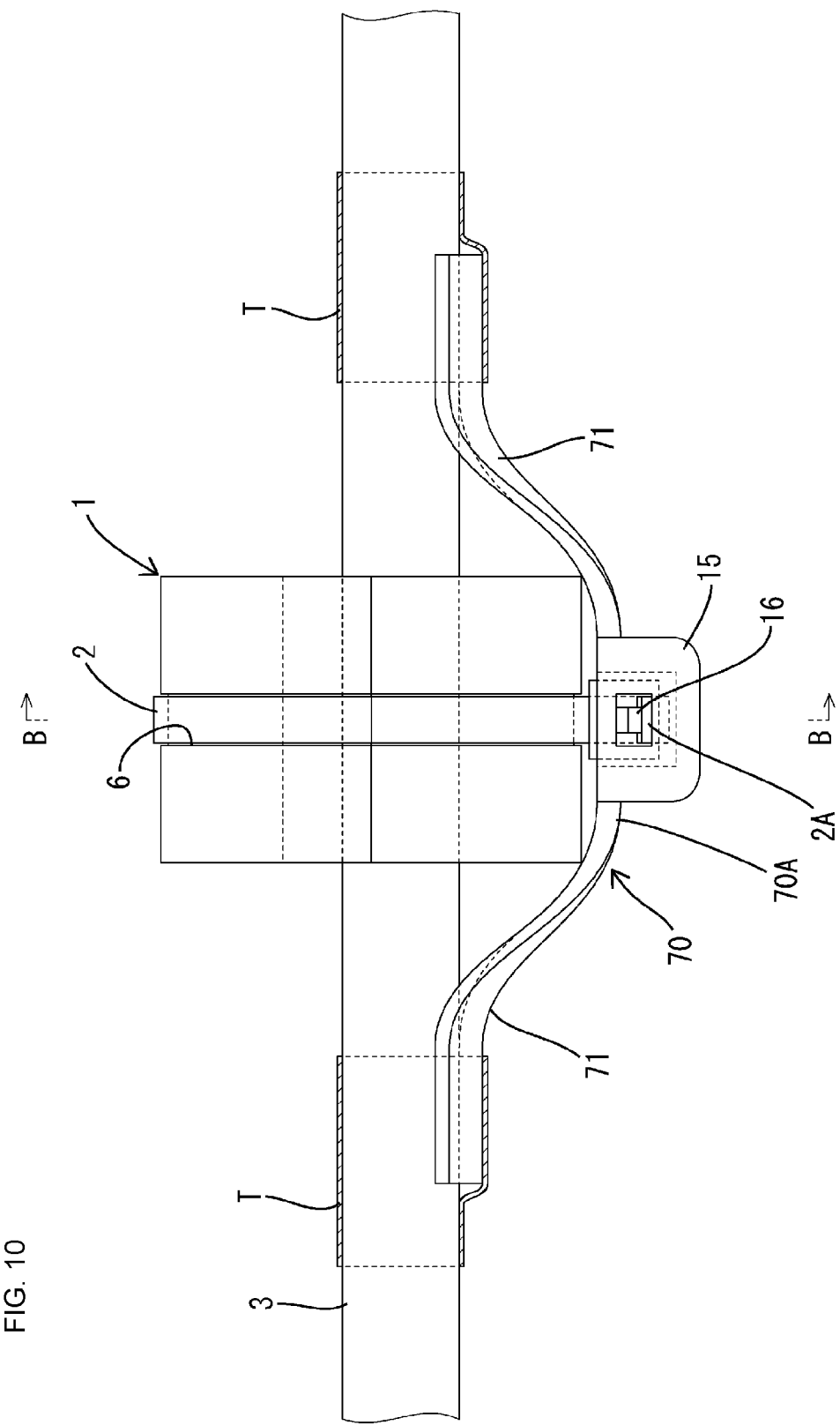
FIG. 10 is a front elevational view according to Embodiment 7.
Figure 11:
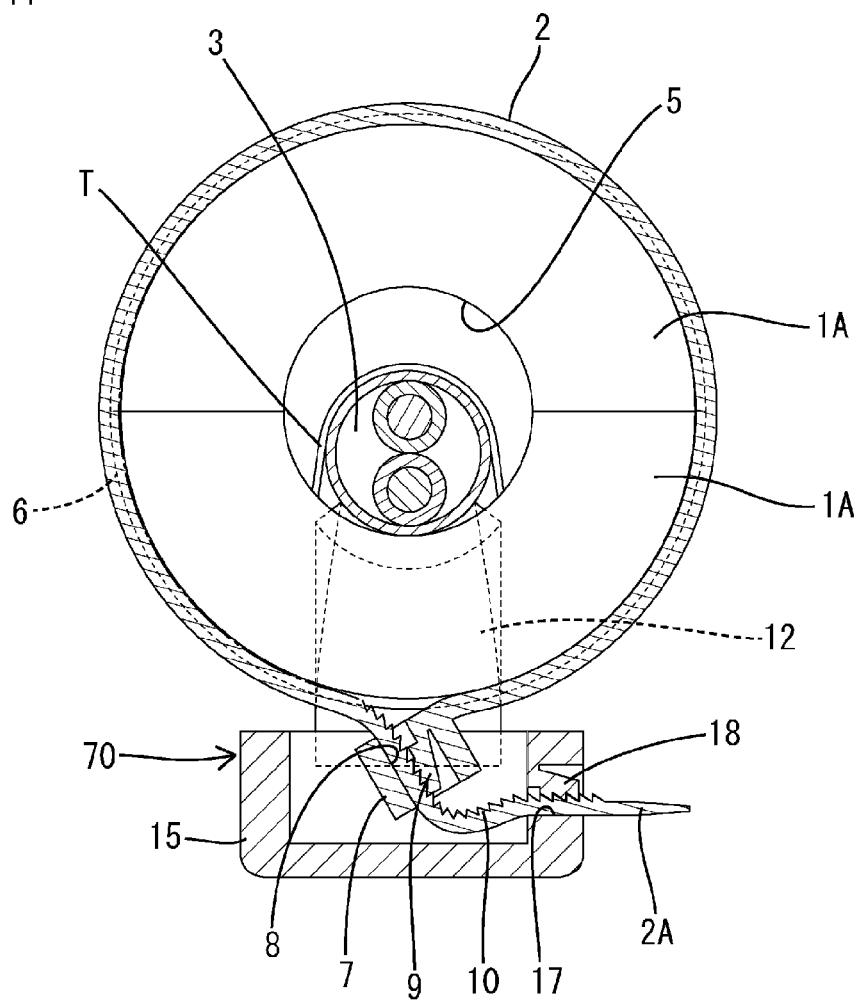
FIG. 11 is a cross-sectional view taken along a line B-B in FIG. 10.

FIGS. 10 and 11 show Embodiment 7 of the present invention. In Embodiment 7, the holders 4 and 40 in Embodiments 1 and 4, respectively, are modified. A holder 70 in this example differs from the holders 4 and 40 in Embodiments 1 and 4 in that the core accommodating portion 11 in Embodiments 1 and 4 is not provided, and accordingly, the holder 70 does not include the pressing walls 13 either. On the other hand, the holder 70 is the same as the holders 4 and 40 in those embodiments in that a core attaching portion 70A is formed in a base portion of the holder 70, the protruding portion 15 having the holder-side locking-receiving portion 16 is formed in a lower face of the core attaching portion 70A, and a pair of electric wire fixing portions 71 are provided.

In Embodiment 7 with the above-described configuration as well, the magnetic core 1 is maintained in an aligned state without loosening by the clamping band 2. In this regard, Embodiment 7 can also achieve the same effects as those of any of the other embodiments.

Note that, although the magnetic core 1 is substantially entirely exposed even in a state of being attached to the holder 70, this does not cause any problem in practice as long as the entire fixing structure is installed in an environment where no other components or substances interfere therewith.

Embodiment 8

Figure 12:
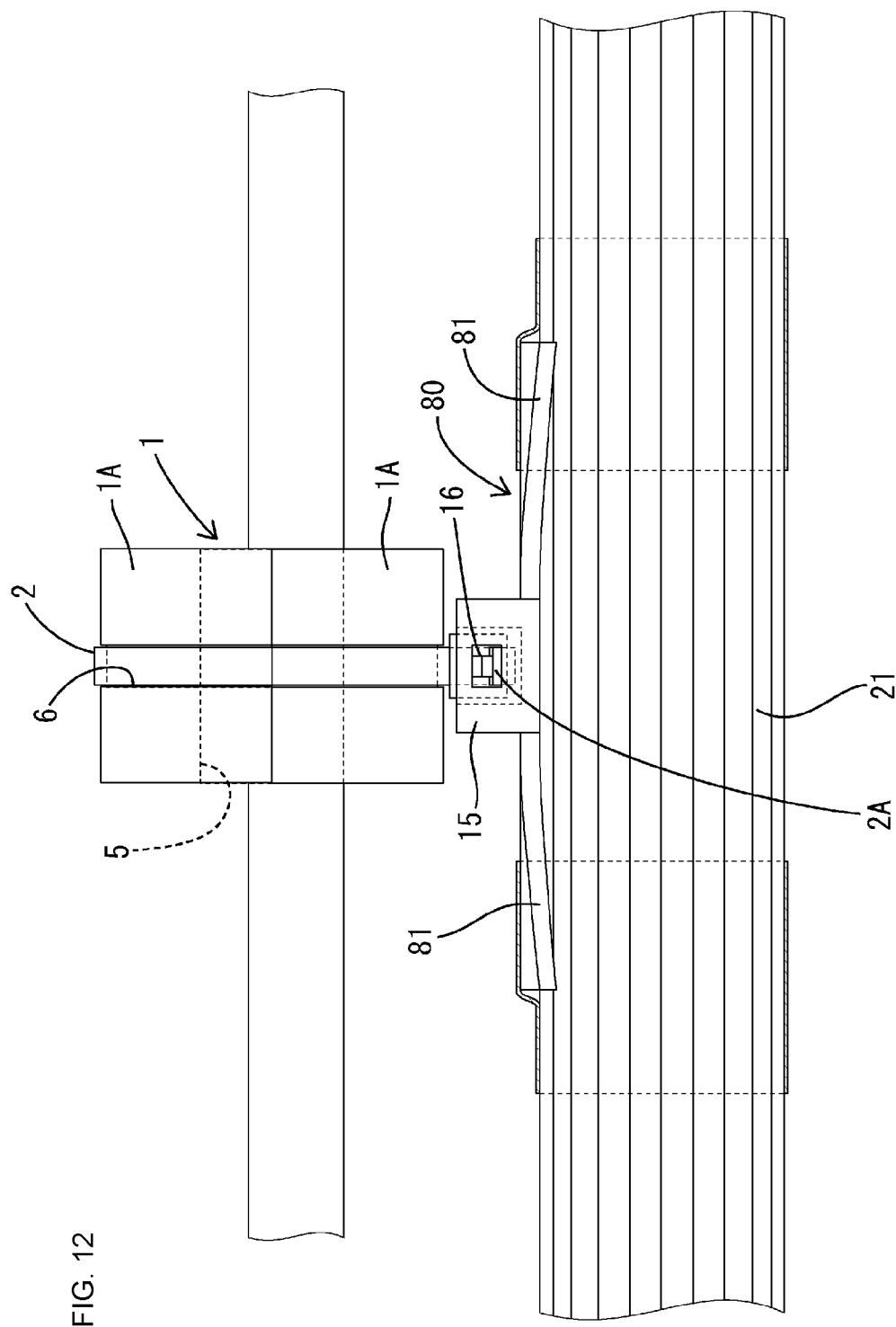
FIG. 12 is a front elevational view according to Embodiment 8.

FIG. 12 shows Embodiment 8 of the present invention. In Embodiment 8, the fixing member in Embodiment 7 is changed from the electric wire 3 to the wire harness 21 that is arranged parallel to the electric wire 3, and a holder 80 is fixed to the wire harness 21 by winding the tape T around a harness fixing portion 81, which is provided in the holder 80. The holder 80 also differs from that in Embodiment 7 in that the protruding portion 15 having the holder-side locking-receiving portion 16 is formed in an upper face of a base portion of the holder 80. Other structures are the same as those of Embodiment 7, and accordingly, the same effects can be achieved. In addition, Embodiment 8 contributes to stabilization of the routing path of the wire harness and the electric wire 3.

Embodiment 9

Figure 13:
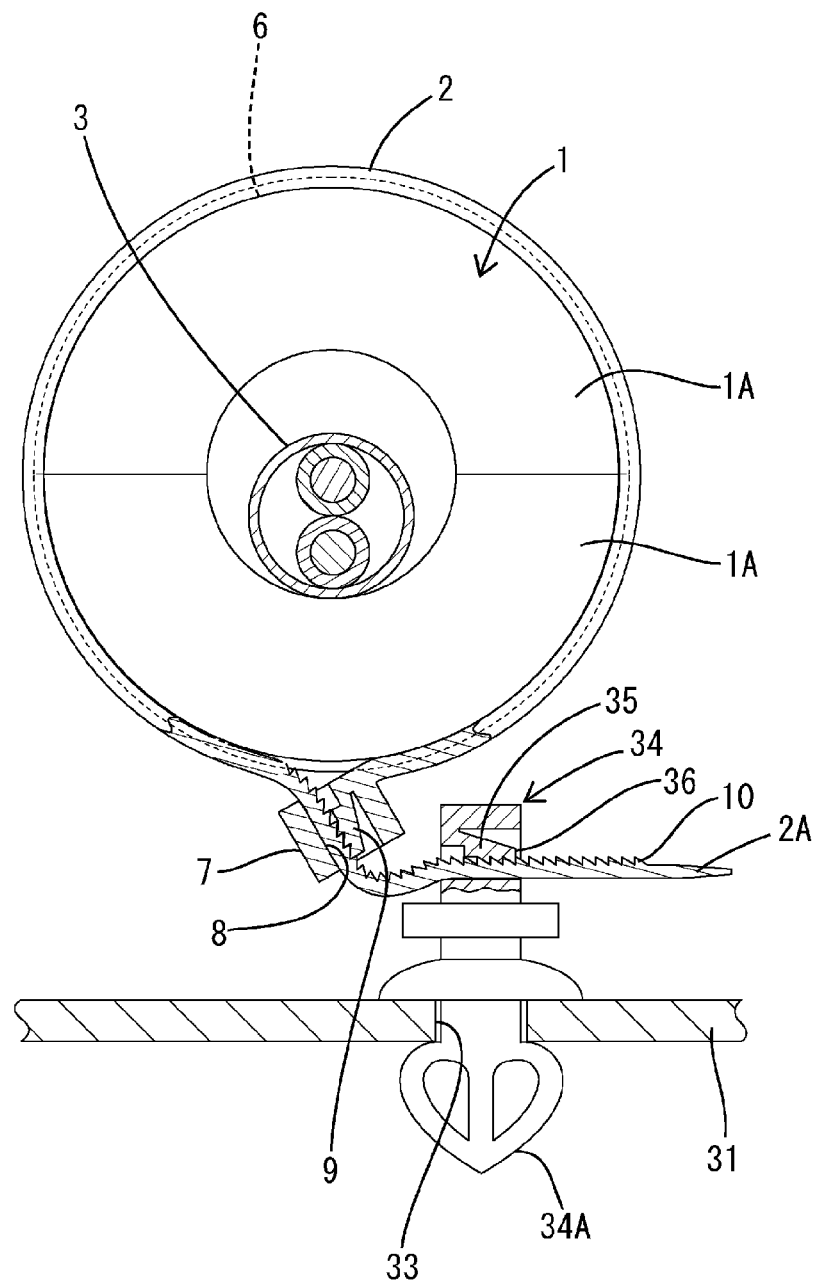
FIG. 13 is a partial breakaway view of a fixing structure according to Embodiment 9 as viewed from the side.

FIG. 13 shows Embodiment 9 of the present invention. In Embodiment 9, the holders 30 and 60 are omitted from the Embodiments 3 and 6, respectively, and the magnetic core 1 is directly locked on the body 31 side via the clip 34. Other structures are the same as those of Embodiments 3 and 6.

In Embodiment 9 having the above-described configuration as well, the magnetic core 1 is held in an aligned state without loosening by the clamping band 2. In this regard, Embodiment 9 can also achieve the same effects as any of the other embodiments, and additionally has an effect of simplifying the configuration of the entire fixing structure due to not using a holder.

Embodiment 10

Figure 14:
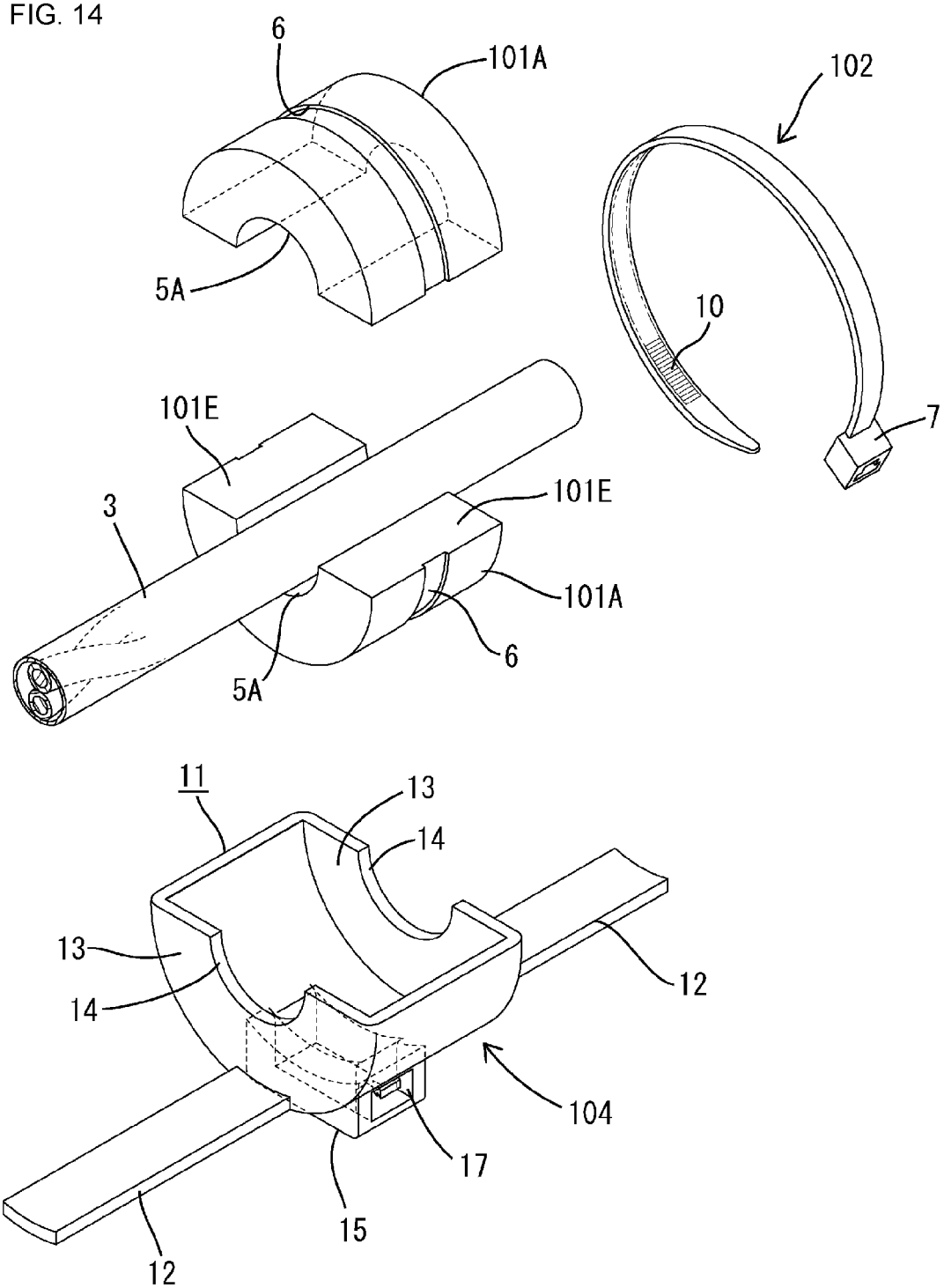
FIG. 14 is an exploded perspective view related to a magnetic core fixing structure according to Embodiment 10.
Figure 15:
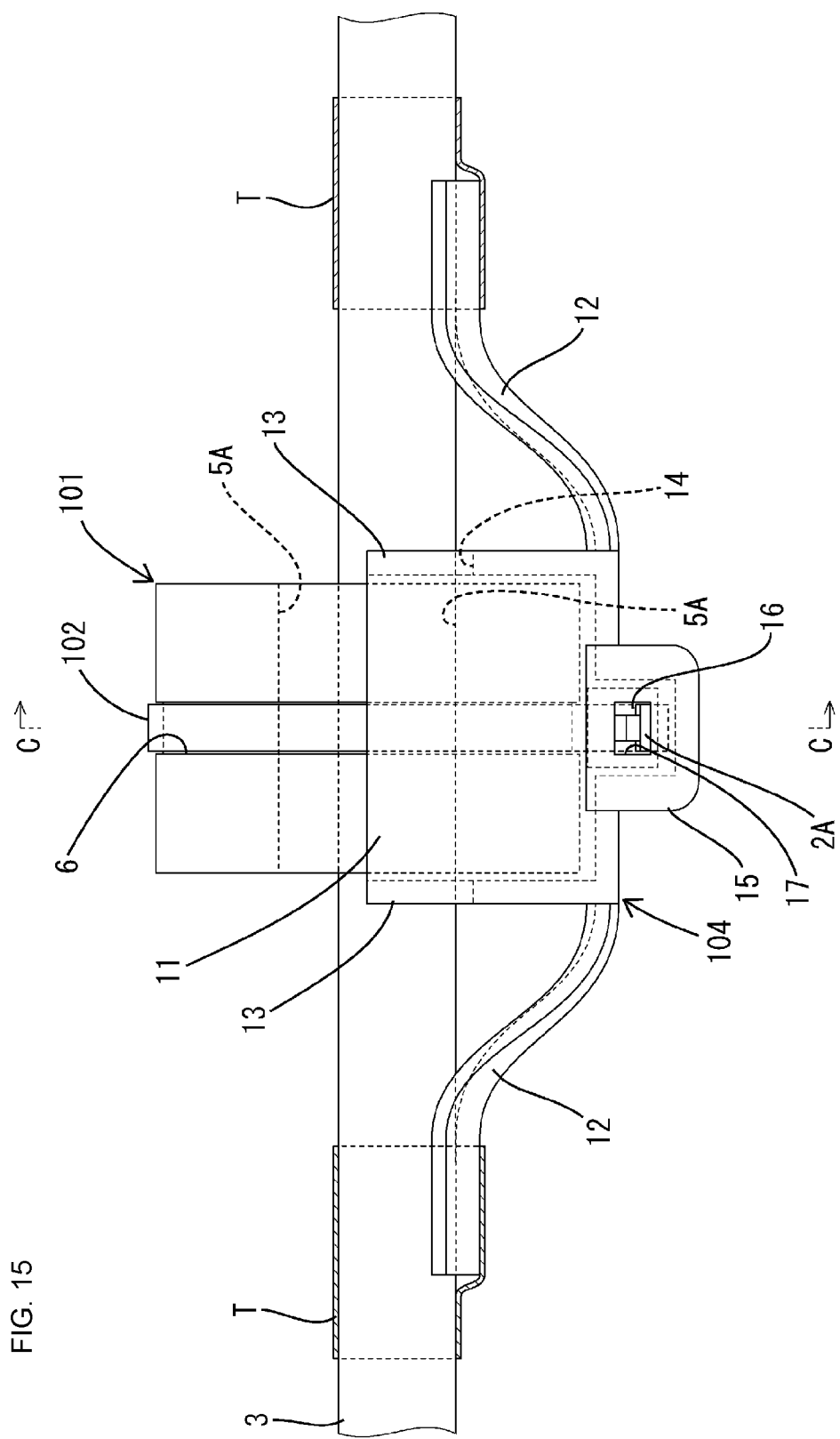
FIG. 15 is a front elevational view related to the same.
Figure 16:
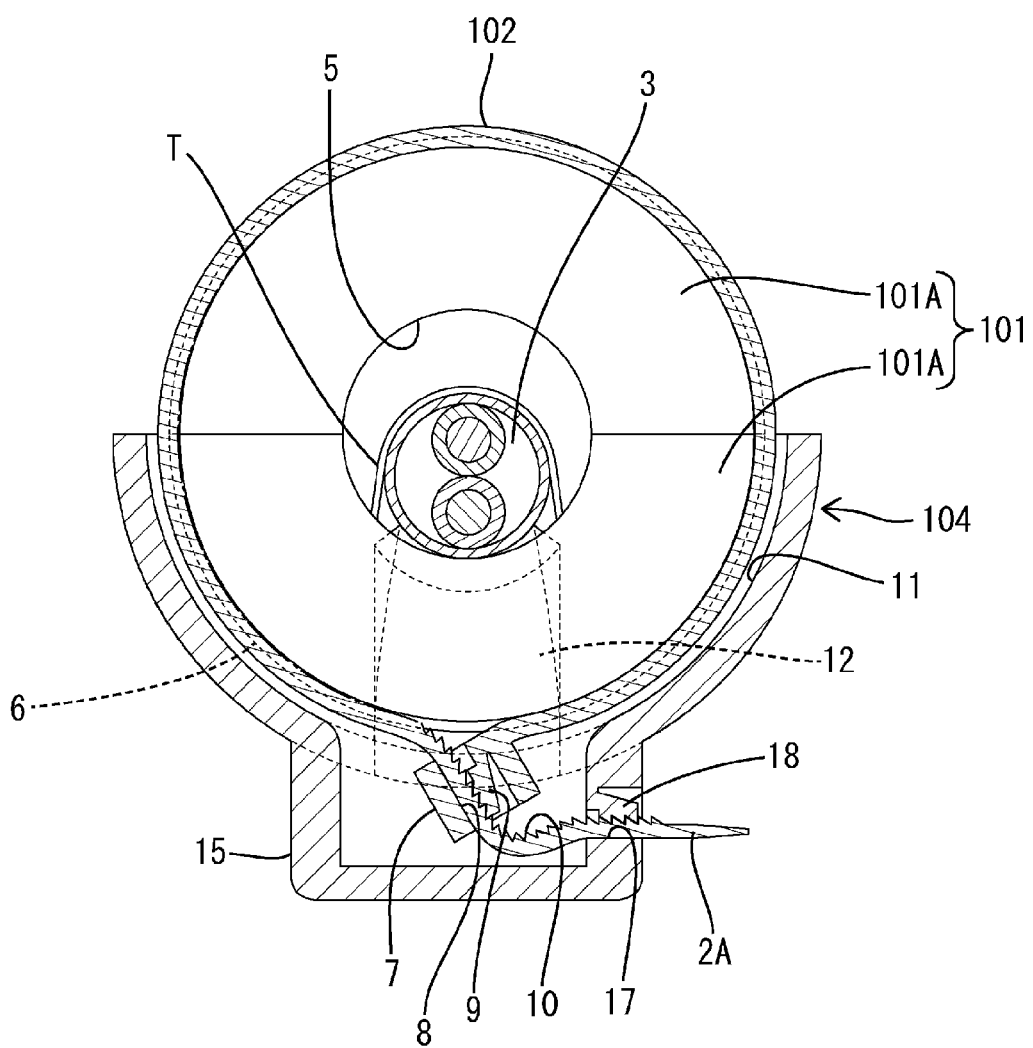
FIG. 16 is a cross-sectional view taken along a line C-C in FIG. 15.

FIGS. 14 to 16 show Embodiment 10 of the present invention. Embodiment 10 is intended to release heat generated from the magnetic core 101 and heat that is generated from the electric wire 3, which passes through the magnetic core 101, and is transmitted to the magnetic core 101. For this reason, a different configuration of the magnetic core is employed, and the material of a clamping band 102 (binding member) and a holder 104 (enclosure) is changed.

The magnetic core 101 includes a filter body having a noise filter function, such as a ferrite core, and a non-magnetic layer (not shown). The magnetic core 101 is configured by combining a pair of core sections 101A, similarly to Embodiment 1. The non-magnetic layer spans over the entire area of an outer face of the filter body, substantially excluding end faces 101E in a circumferential direction, in which the core sections 101A come into direct contact with each other. This non-magnetic layer magnetically insulates the filter body and the clamping band 102 from each other, and also magnetically insulates the filter body and the holder 104 from each other.

The clamping band 2 in Embodiment 1 is made of a synthetic resin, whereas the clamping band 102 in Embodiment 10 is made of a material having a higher heat conductivity than that of the magnetic core 101. A specific material of the clamping band 102 may be a flexible metal or the like. In addition, the holder 4 in Embodiment 1 is made of a synthetic resin, whereas the holder 104 in Embodiment 10, including the electric wire fixing portions 12, is made of a material having a higher heat conductivity than that of the magnetic core 101, and also having a higher heat conductivity than that of the clamping band 102. A specific material of the holder 104 may be a metal having a low flexibility, or the like.

In Embodiment 10, heat is generated as a result of Joule heat of the electric wire 3 being transmitted to the magnetic core 101, and as a result of the magnetic core 101 absorbing magnetic flux generated on the electric wire and the absorbed magnetic flux being exchanged to heat. If this heat is not effectively released and the temperature of the magnetic core 101 is kept high, there is a concern that the noise reduction function deteriorates.

Embodiment 10 can effectively handle such a situation. That is to say, the heat of the magnetic core 101 is transmitted to the holder 104 by the clamping band 102. Since the magnetic core 101 is accommodated in a loosening state within the holder 104, there is an air space between the outer face of the magnetic core 101 and the inner face of the holder 104. Accordingly, comparing a heat transmission path through which the heat is transmitted from the magnetic core 101 (excluding a portion bound by the clamping band 102) via the air space to the holder 104 with a heat transmission path through which the heat is transmitted via the magnetic core 101 and the clamping band 102 to the holder 104, the heat resistance is lower, as a whole, in the heat transmission path through which the heat passes through the clamping band 102 that is directly bound to the outer circumferential face of the magnetic core 101 and has a high heat conductivity. Thus, the heat from the electric wire 3 and the magnetic core 101 is transmitted to the electric wire 3 preferentially via the clamping band, the holder 104, and both electric wire fixing portions 12, and is released to the air from a wide area of the outer face of the electric wire 3. As a result, by causing the electric wire 3 to function as a heat-releasing member, it is possible to suppress an increase in the temperature of the clamping band 102, and to effectively suppress an increase in the temperature of the magnetic core 101. Since this also contributes to heat release from the electric wire 3, a local increase in the temperature of the electric wire 3 itself is also effectively suppressed. Accordingly, a drop in the current value that is allowed for the electric wire 3 can be suppressed.

Embodiment 11

Figure 17:
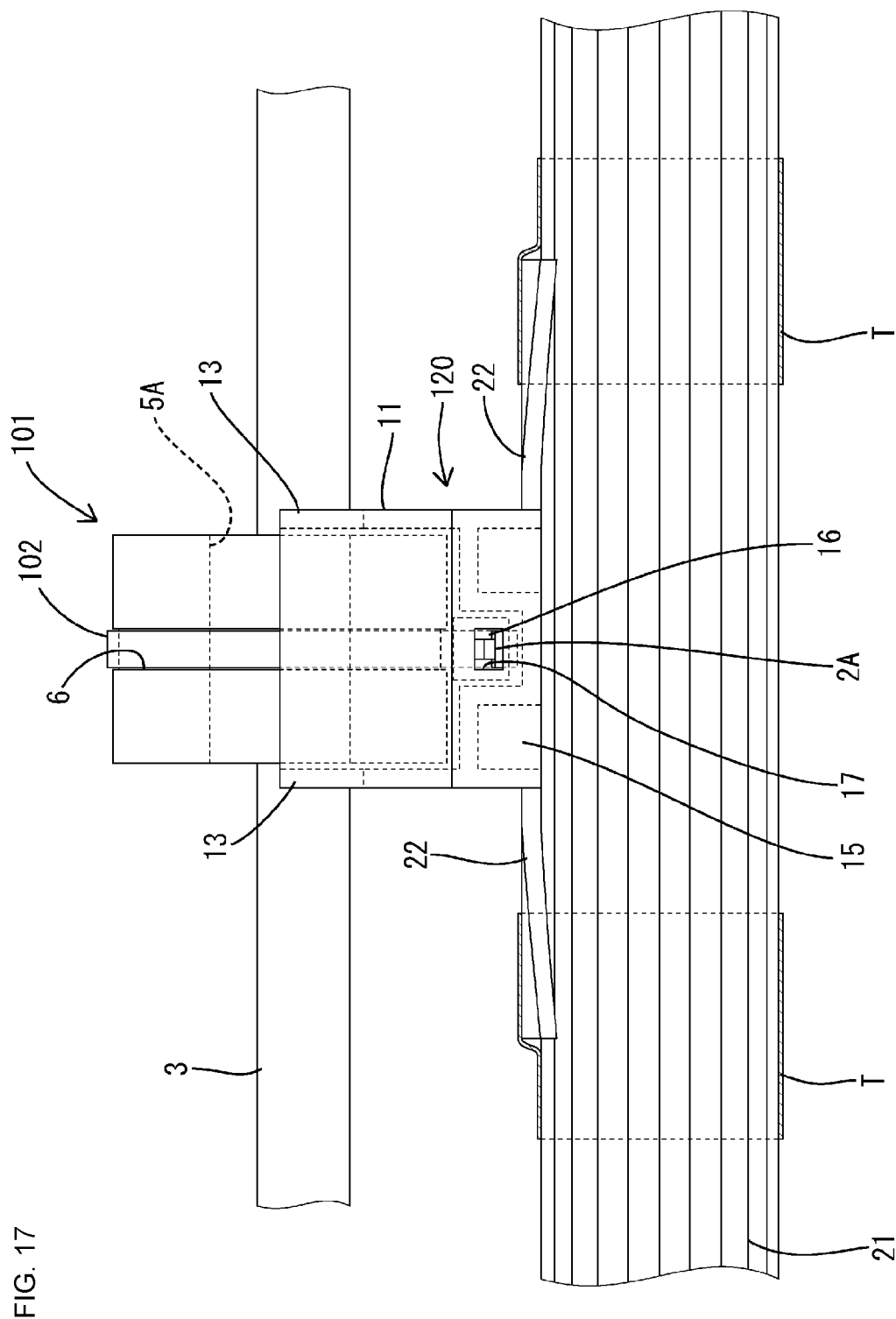
FIG. 17 is a front elevational view according to Embodiment 11.

FIG. 17 shows Embodiment 11 of the present invention. In Embodiment 11, the magnetic core 1 and the clamping band 2 in Embodiment 2 are replaced with a magnetic core 101 and a clamping band 102 that have the same configuration as that in Embodiment 10. The shape of a holder 120 in Embodiment 11 is the same as the shape of the holder 20 in Embodiment 4, whereas the material of the holder 120 in Embodiment 11 is changed to the same material as that of the holder 104 in Embodiment 10.

In Embodiment 11, the holder 120 is configured so that a lower face portion thereof and both electric wire fixing portions 22 come into contact with an outer circumferential face of the wire harness 21, and the wire harness 21 functions as a heat-releasing member. That is to say, the heat from the magnetic core 101 is transmitted to the wire harness 21 via the clamping band 102 and the holder 104 (electric wire fixing portions 22), and is released to the air from an outer face of the wire harness that extends in the length direction over a wide area.

The other effects are the same as those of Embodiment 10, including the point that a local increase in the temperature of the electric wire 3 is also effectively suppressed due to the heat from the magnetic core 101 being effectively released.

Embodiment 12

Figure 18:
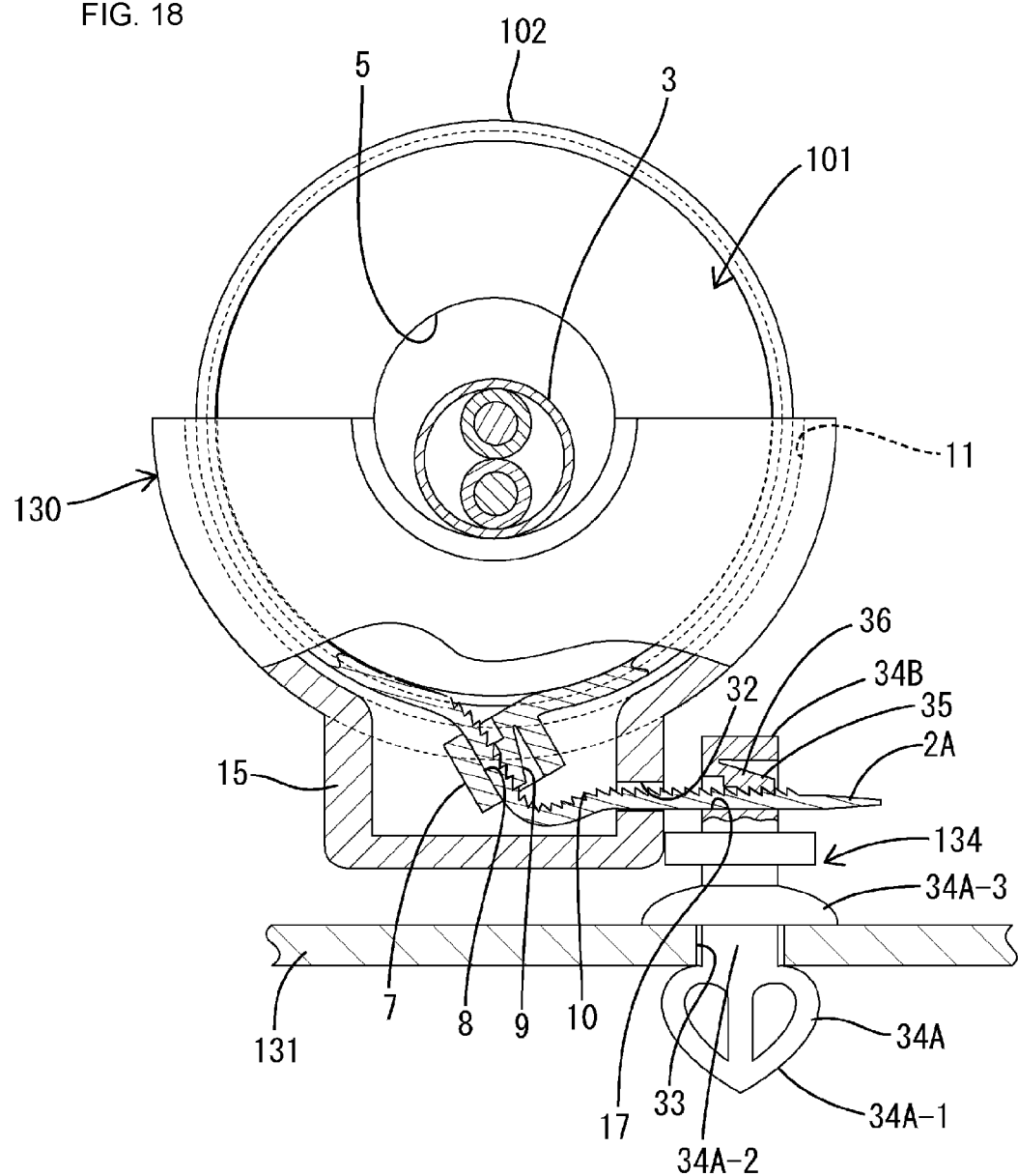
FIG. 18 is a partial breakaway view of a fixing structure according to Embodiment 12 as viewed from the side.

FIG. 18 shows Embodiment 12 of the present invention. In Embodiment 12, the magnetic core 1 and the clamping band 2 in Embodiment 3 are replaced with a magnetic core 101 and a clamping band 102 that have the same configuration as those in Embodiments 10 and 11. The shape of a holder 130 in Embodiment 12 is the same as the shape of the holder 30 in Embodiment 5, whereas the material of the holder 130 in Embodiment 12 is changed to the same material as that of the holder 104 in Embodiments 10 and 11. Furthermore, the shapes of a body 131 and a clip 134 in Embodiment 12 are the same as the shapes of the body 31 and the clip 34 in Embodiment 3, whereas the materials of the body 131 and the clip 134 in Embodiment 12 are changed to materials with a higher heat conductivity than that of the magnetic core 101 and the clamping band 102.

In Embodiment 12, the holder 130 is connected to the clip 134 via the remaining portion 2A, and is connected to the body 131, which is made of a metal, by this clip 134 (heat-transmitting member). Accordingly, the heat from the magnetic core 101 is transmitted preferentially to the body 131, which is a heat-releasing member, via the clamping band 102, the holder 130, and the clip 134, and is released to the air through a wide area of the body 131. As a result, an increase in the temperature of the magnetic core 101 is suppressed, and a local increase in the temperature of the electric wire 3 is also suppressed due to this. The thus-achieved effects related to suppression of an increase in the temperature are the same as those of Embodiment 10.

Embodiment 13

Figure 19:
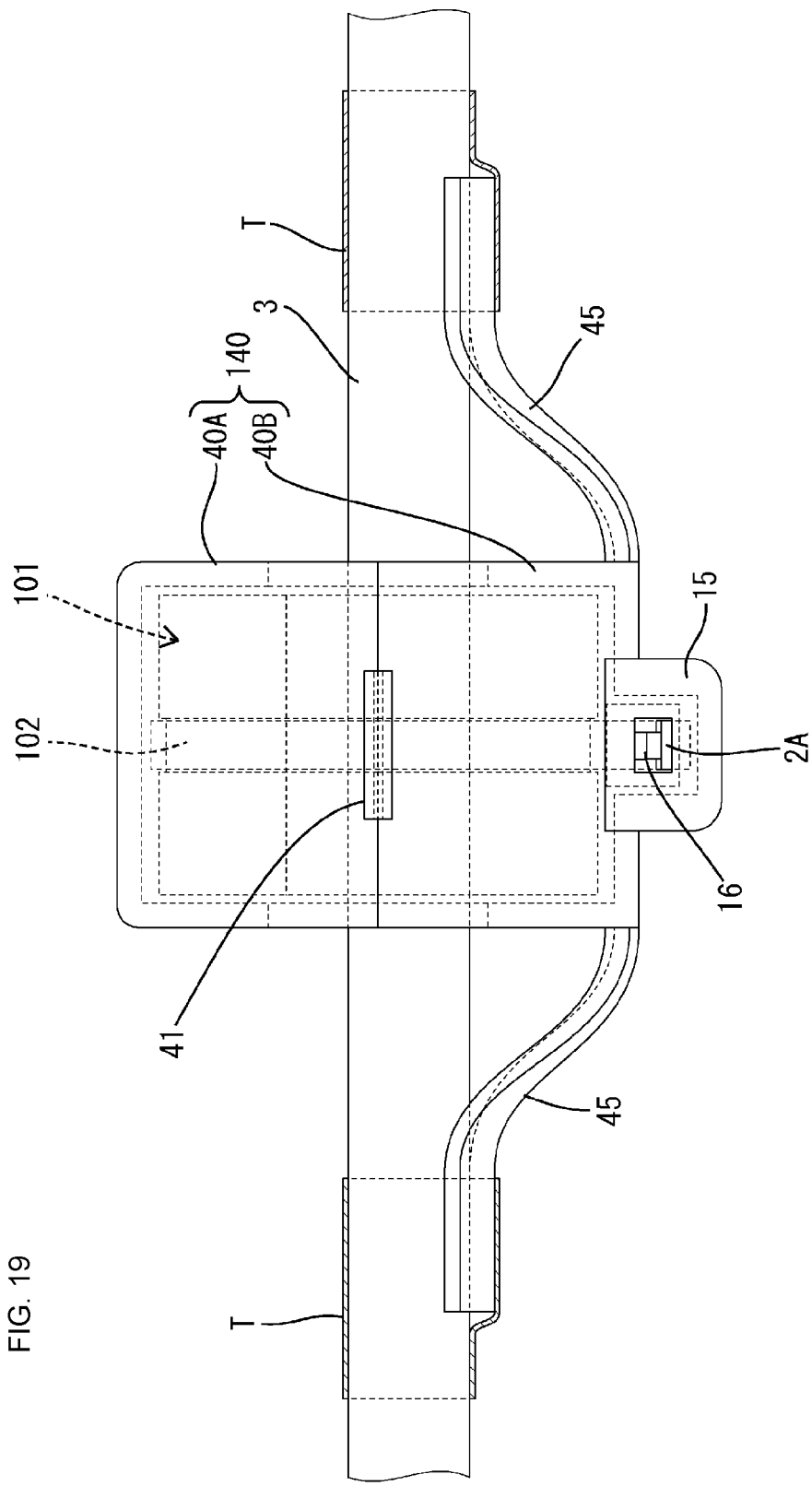
FIG. 19 is a front elevational view according to Embodiment 13.
Figure 20:
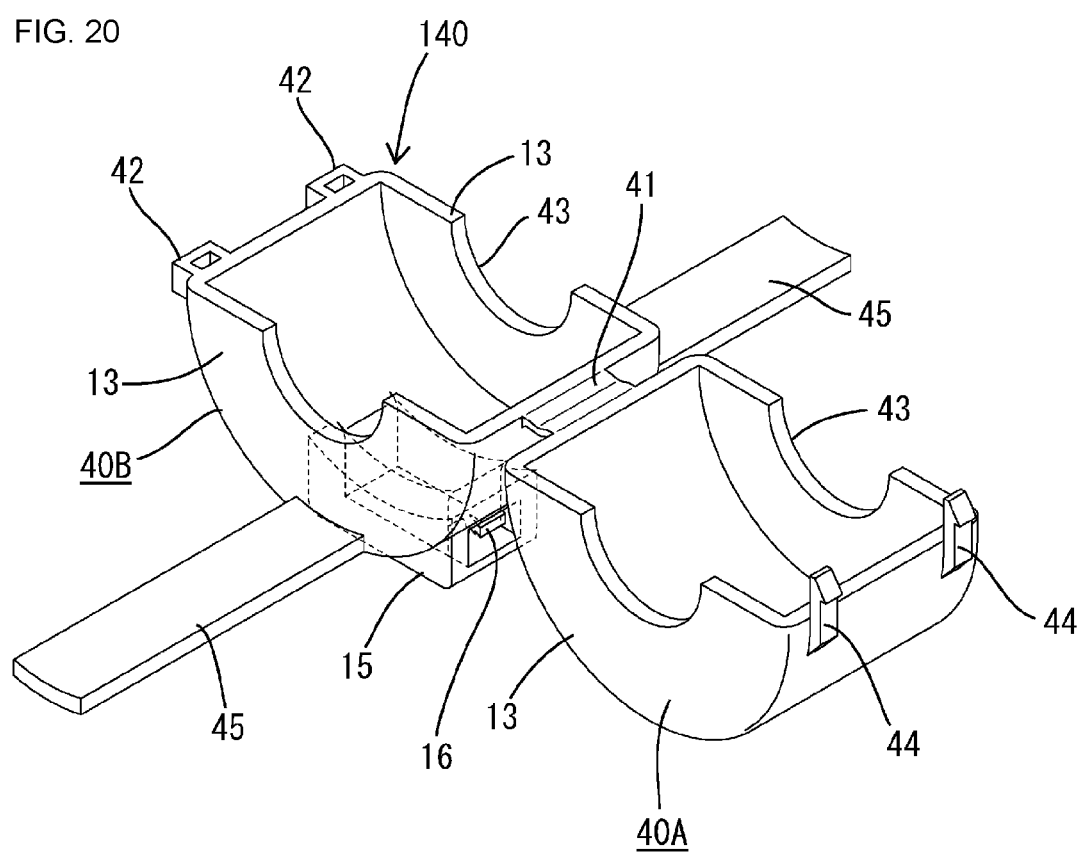
FIG. 20 is a perspective view showing an open state of an upper holder and a lower holder according to the same.

FIGS. 19 and 20 show Embodiment 13 of the present invention. In Embodiment 13, the magnetic core 1 and the clamping band 2 in Embodiment 4 are replaced with a magnetic core 101 and a clamping band 102 that have the same configuration as those in Embodiments 10 to 12. The shape of a holder 140 in Embodiment 13 is the same as the shape of the holder 40 in Embodiment 4, whereas the material of the holder 140 in Embodiment 13 is changed to the same material as that of the holder 104 in Embodiments 10 to 12. The heat-releasing member in Embodiment 13 is the electric wire 3.

The effects related to heat conduction and the suppression of an increase in the temperature of the magnetic core 101 and the electric wire 3 in Embodiment 13 are the same as those of Embodiment 10.

Embodiment 14

Figure 21:
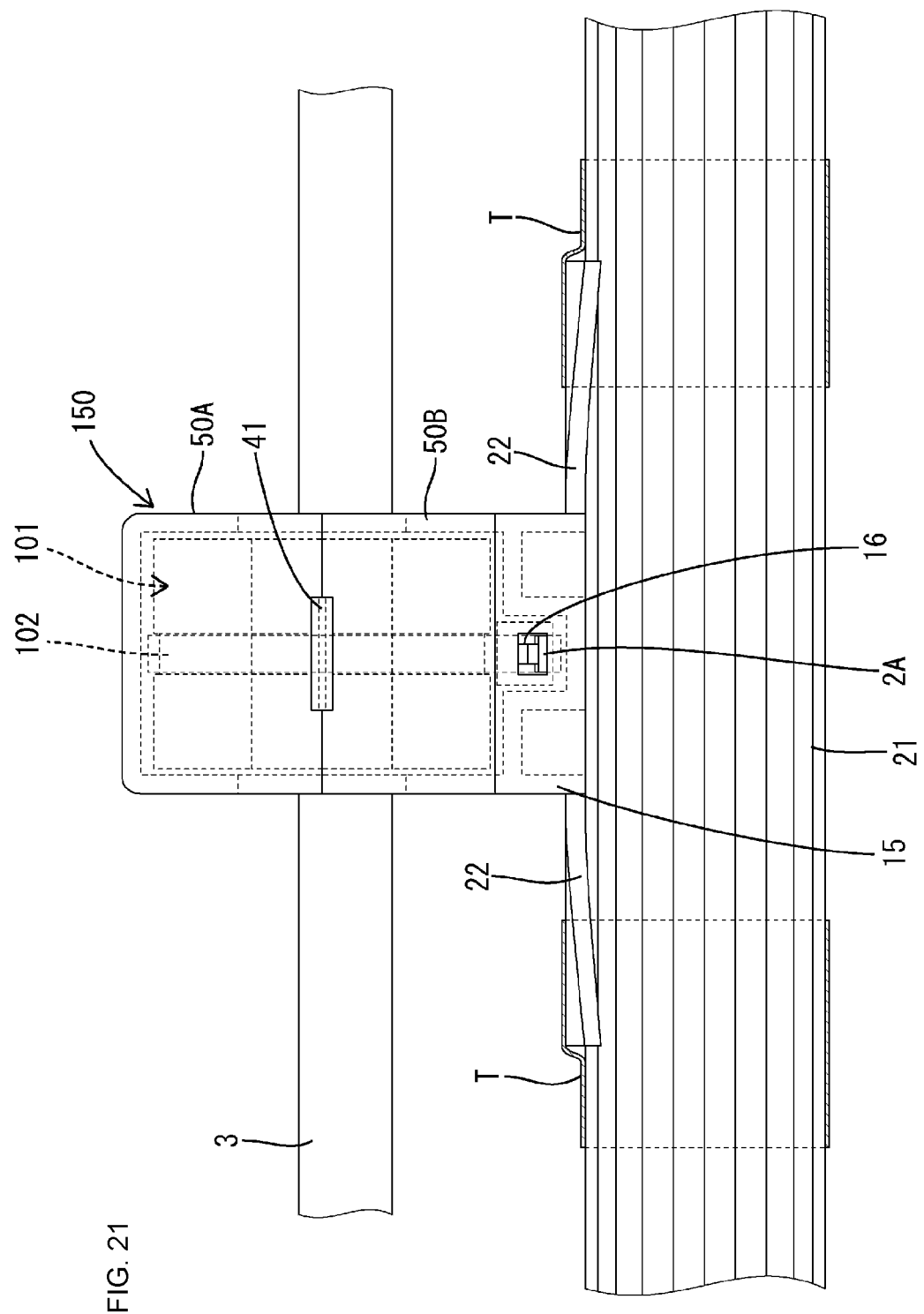
FIG. 21 is a front elevational view according to Embodiment 14.

FIG. 21 shows Embodiment 14 of the present invention. In Embodiment 14, the magnetic core 1 and the clamping band 2 in Embodiment 5 are replaced with a magnetic core 101 and a clamping band 102 that have the same configuration as those in Embodiments 10 to 13. The shape of a holder 150 in Embodiment 14 is the same as the shape of the holder 50 in Embodiment 5, whereas the material of the holder 150 in Embodiment 14 is changed to the same material as that of the holder 104 in Embodiments 10 to 13. The heat-releasing member in Embodiment 14 is a wire harness 22.

The effects related to heat conduction and the suppression of an increase in the temperature of the magnetic core 101 and the electric wire 3 in Embodiment 14 are the same as those of Embodiment 10.

Embodiment 15

Figure 22:
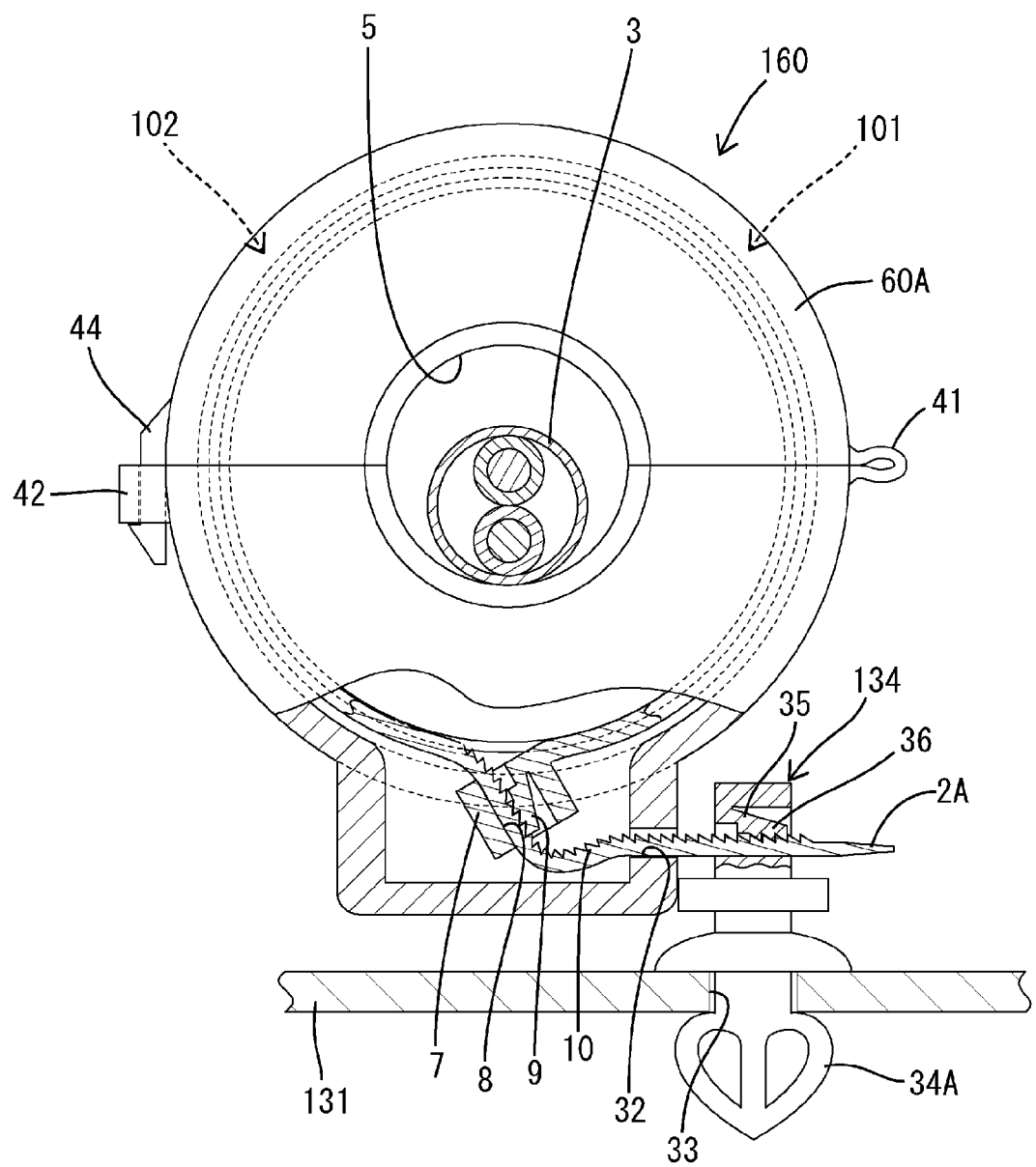
FIG. 22 is a partial breakaway view of a fixing structure according to Embodiment 15 as viewed from the side.

FIG. 22 shows Embodiment 15 of the present invention. In Embodiment 15, the magnetic core 1 and the clamping band 2 in Embodiment 6 are replaced with a magnetic core 101 and a clamping band 102 that have the same configuration as those in Embodiments 10 to 14. The shape of a holder 160 in Embodiment 15 is the same as the shape of the holder 60 in Embodiment 6, whereas the material of the holder 160 in Embodiment 15 is changed to the same material as that of the holder 104 in Embodiments 10 to 14. Furthermore, the shapes of the body 131 and the clip 134 in Embodiment 15 are the same as the shapes of the body 31 and the clip 34 in Embodiment 6, whereas the materials of the body 131 and the clip 134 (heat-transmitting member) in Embodiment 15 are changed to materials with a higher heat conductivity than that of the magnetic core 101 and the clamping band 102. The heat-releasing member in Embodiment 15 is the body 131, which is made of a metal.

The effects related to heat conduction and the suppression of an increase in the temperature of the magnetic core 101 and the electric wire 3 in Embodiment 15 are the same as those of Embodiment 10.

Embodiment 16

Figure 23:
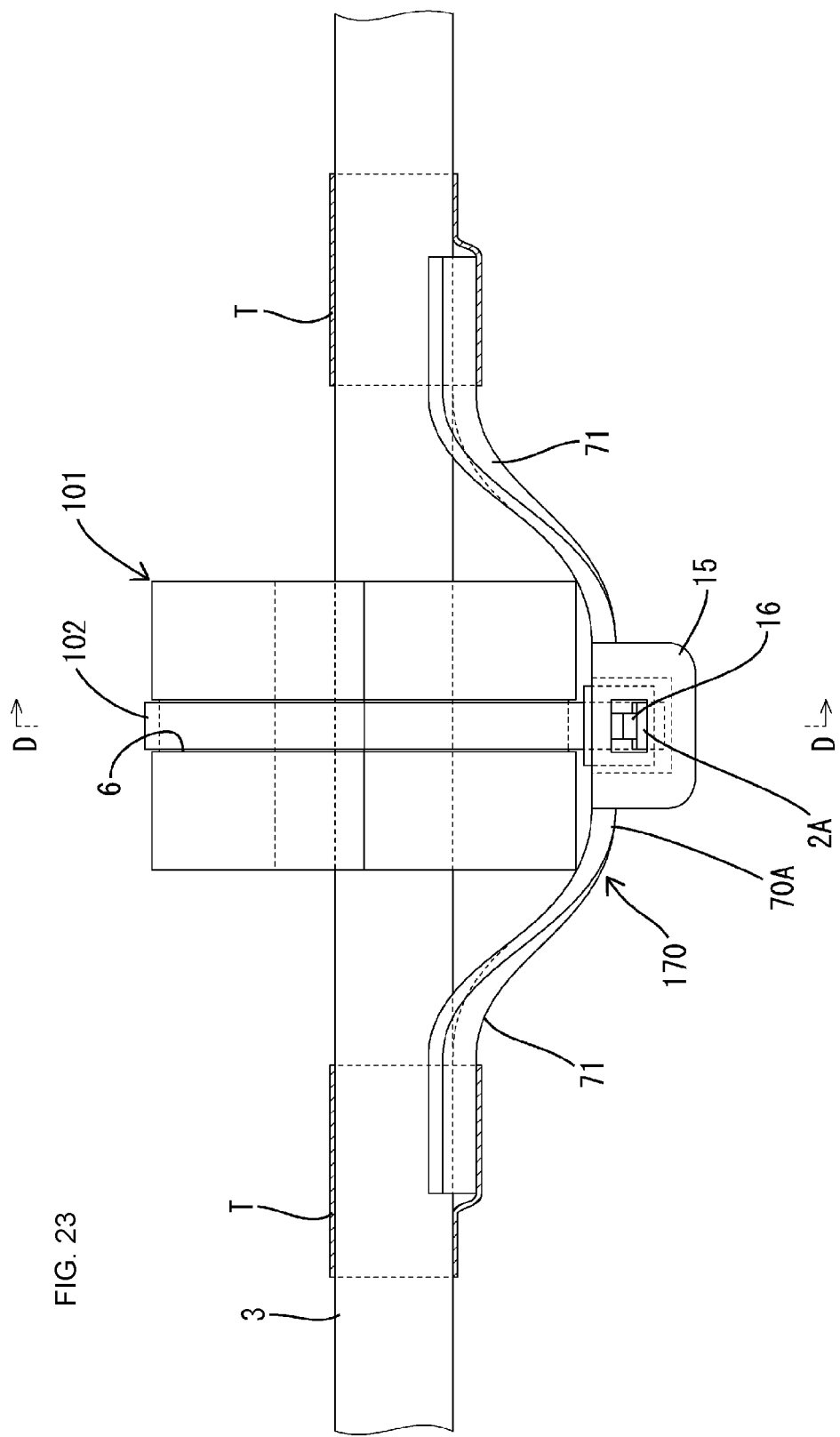
FIG. 23 is a front elevational view according to Embodiment 16.
Figure 24:
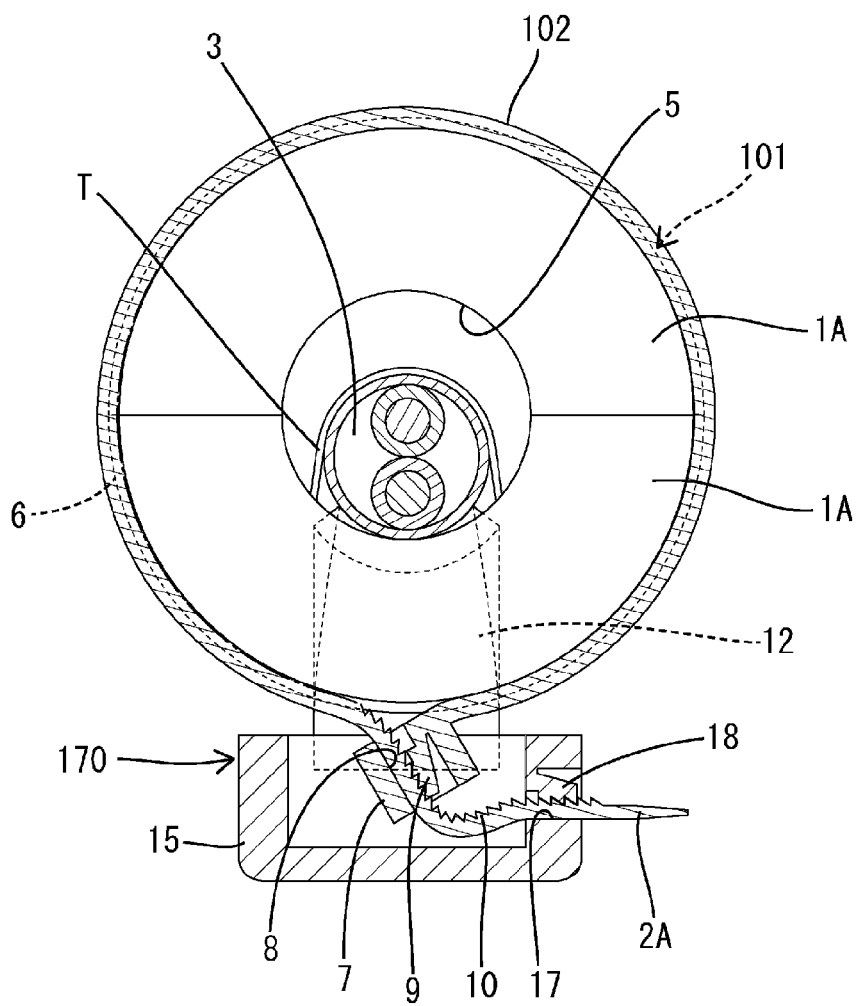
FIG. 24 is a cross-sectional view taken along a line D-D in FIG. 23.

FIGS. 23 and 24 show Embodiment 16 of the present invention. In Embodiment 16, the magnetic core 1 and the clamping band 2 in Embodiment 7 are replaced with a magnetic core 101 and a clamping band 102 that have the same configuration as those in Embodiments 10 to 15. The shape of a holder 170 in Embodiment 16 is the same as that of the holder 70 in Embodiment 7, whereas the material of the holder 170 in Embodiment 16 is changed to a material with a higher heat conductivity than that of the magnetic core 101 and the clamping band 102. The heat-releasing member in Embodiment 16 is the electric wire 3.

The effects related to heat conduction and the suppression of an increase in the temperature of the magnetic core 101 and the electric wire 3 in Embodiment 16 are the same as those of Embodiment 10.

Embodiment 17

Figure 25:
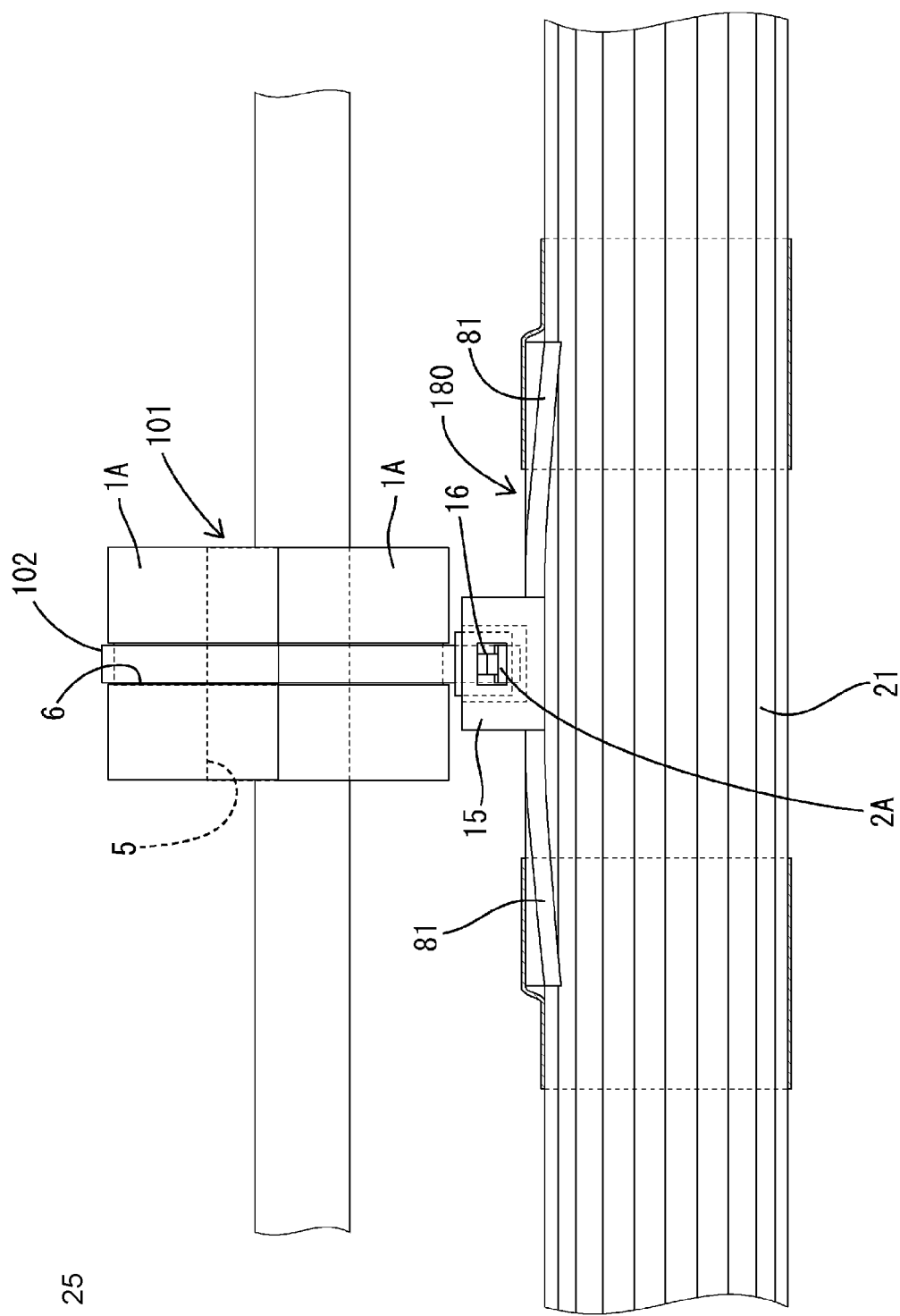
FIG. 25 is a front elevational view according to Embodiment 17.

FIG. 25 shows Embodiment 17 of the present invention. In Embodiment 17, the magnetic core 1 and the clamping band 2 in Embodiment 8 are replaced with a magnetic core 101 and a clamping band 102 that have the same configuration as those in Embodiments 10 to 16. The shape of a holder 180 in Embodiment 17 is the same as that of the holder 80 in Embodiment 8, whereas the material of the holder 180 in Embodiment 17 is changed to a material with a higher heat conductivity than that of the magnetic core 101 and the clamping band 102. The heat-releasing member in Embodiment 17 is the wire harness 21.

The effects related to heat conduction and the suppression of an increase in the temperature of the magnetic core 101 and the electric wire 3 in Embodiment 17 are the same as those of Embodiment 10.

Embodiment 18

Figure 26:
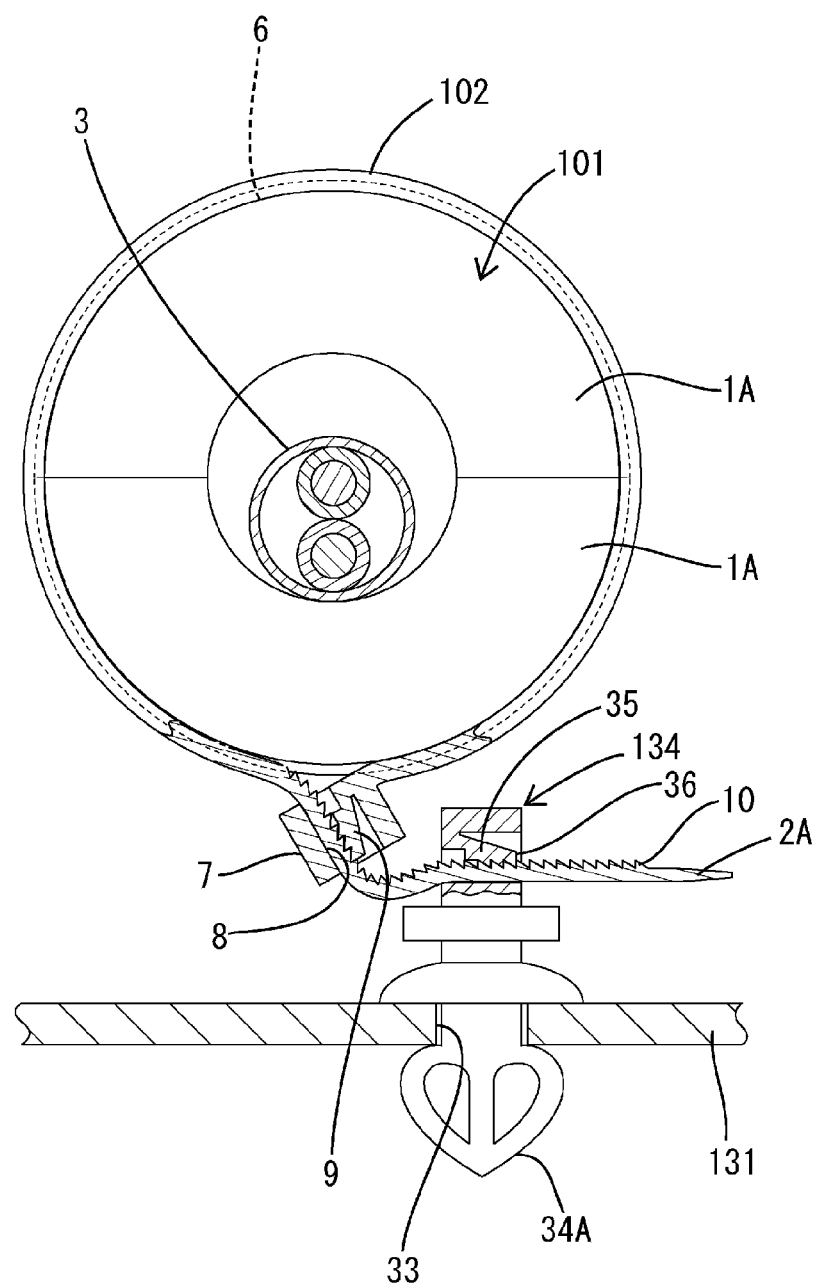
FIG. 26 is a partial breakaway view of a fixing structure according to Embodiment 18 as viewed from the side.

FIG. 26 shows Embodiment 18 of the present invention. In Embodiment 18, the magnetic core 1 and the clamping band 2 in Embodiment 9 are replaced with a magnetic core 101 and a clamping band 102 that have the same configuration as those in Embodiments 10 to 16. Furthermore, the shapes of the body 131 and the clip 134 in Embodiment 18 are the same as the shapes of the body 31 and the clip 34 in Embodiment 9, whereas the materials of the body 131 and the clip 134 (heat-transmitting member) in Embodiment 18 are changed to materials with a higher heat conductivity than that of the magnetic core 101 and the clamping band 102. The heat-releasing member in Embodiment 18 is the body, which is made of a metal.

The effects related to heat conduction and the suppression of an increase in the temperature of the magnetic core 101 and the electric wire 3 in Embodiment 18 are the same as those of Embodiment 10.

Modification of Locking-Receiving Portion

Figure 27:
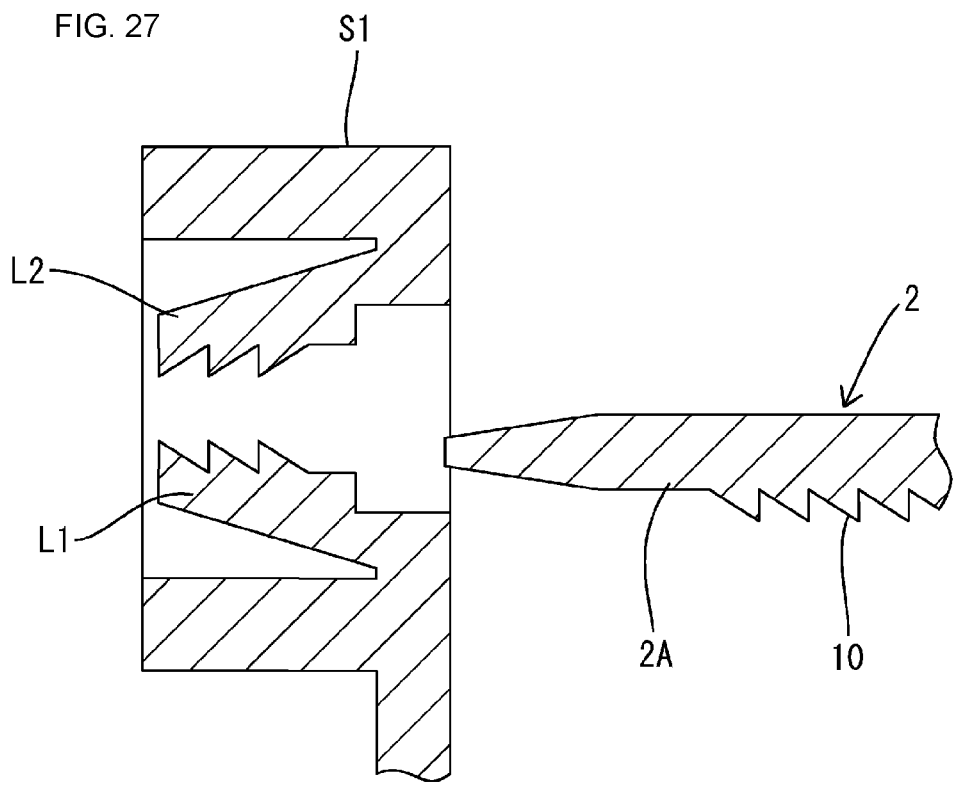
FIG. 27 is a cross-sectional view showing a modification of a locking-receiving portion.

FIG. 27 shows a modification of a locking-receiving portion S. In the above embodiments, only one locking claw 18 and only one locking claw 36 are provided respectively in the holder-side locking-receiving portion 16 and the holder-side locking-receiving portion 35. However, in the modification shown in FIG. 27, a pair of locking claws L1 and L2 are provided facing each other.

This configuration enables the posture of the remaining portion 2A when being inserted into the locking-receiving portion S to be selected between front- and back-facing postures, thereby increasing the flexibility in selection of the posture of the remaining portion 2A when being inserted.

Note that, needless to say, this modification is also applicable to the lock portion 7 of the clamping band 2.

Another Modification of Locking-Receiving Portion

Figure 28:
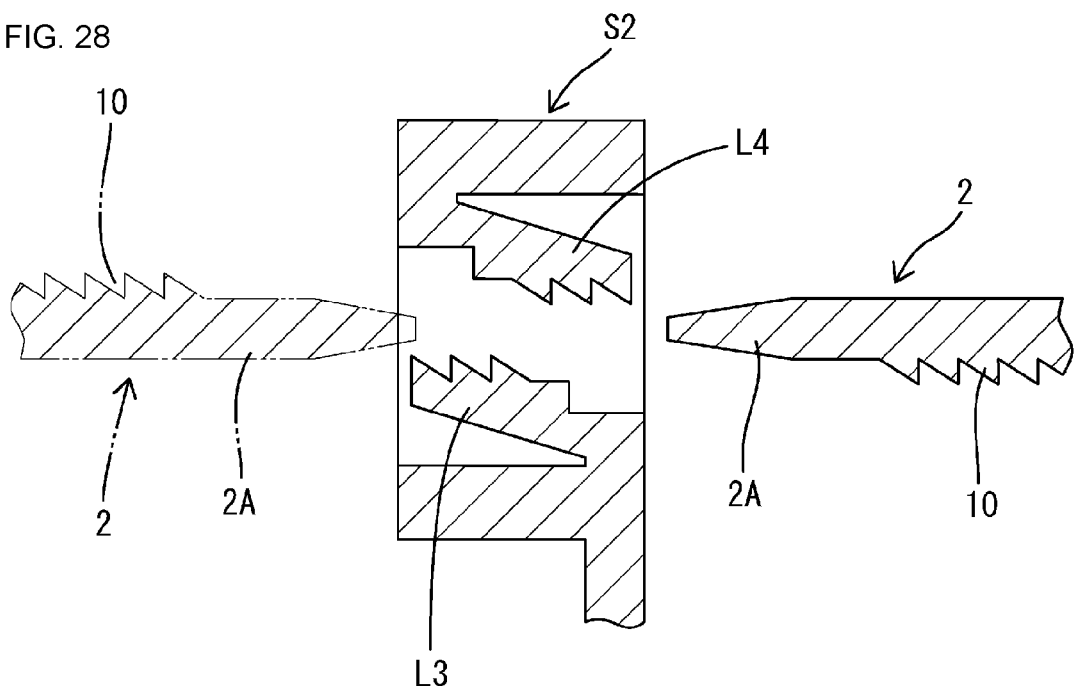
FIG. 28 is a cross-sectional view showing another modification of the locking-receiving portion.

FIG. 28 shows another modification of a locking-receiving portion S2. In FIG. 27, the pair of locking claws L1 and L2 extend in the same direction, whereas, in the modification shown in FIG. 28, these locking claws L3 and L4 are configured to extend in opposite directions.

This configuration enables the direction in which the remaining portion 2A is inserted into the locking-receiving portion S2 to be reversed while inverting the posture of the remaining portion 2A when being inserted. Accordingly, not only the inserting posture but also the inserting direction can be selected.

Modification of Magnetic Core

Figure 29:
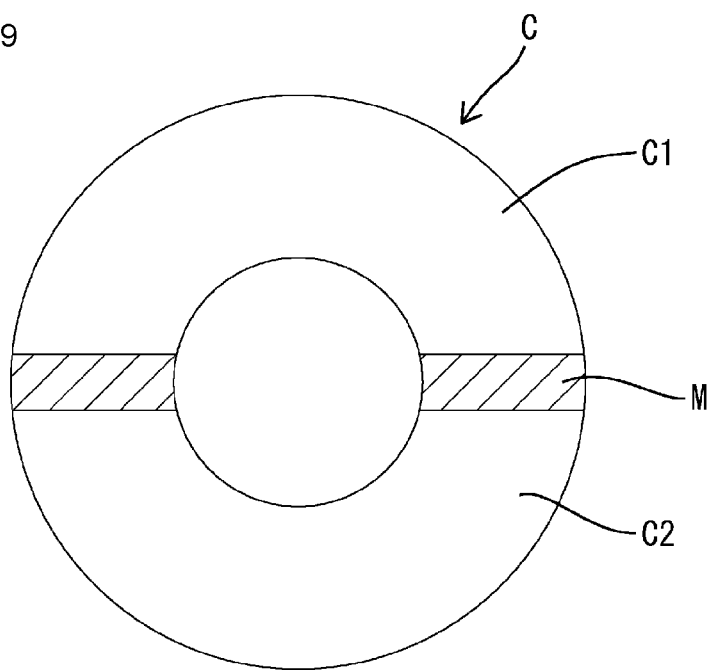
FIG. 29 is a cross-sectional view showing a modification of a magnetic core.

FIG. 29 shows a modification of a magnetic core C. In the above embodiments, the divided faces of the core sections 1A are directly aligned with each other. However, as shown in FIG. 29, a mode may also be employed in which an enclosure M is interposed between the divided faces of core sections C1 and C2. This modification in which the divided faces do not directly face each other due to the enclosure being interposed therebetween is also included in "being aligned" in the present invention. This configuration can also resolve magnetic saturation.

Other Embodiments

The present invention is not limited to the embodiments described in the above description and the drawings. For example, the following embodiments are also encompassed in the technical scope of the present invention.

Although the electric wire 3 is taken as an example of an electric conductor in the above embodiments, a bus bar or a rectangular flat electric wire may also be employed thereas.

(2) Although the magnetic core 1 is divided into two portions in the above embodiments, it may also be divided into more portions.

(3) Although the clamping band 2 is used as a binding means in the above embodiment, another binding member, such as a wire or a string, may also be employed thereas. In short, anything that can tighten and hold the core sections 1A in an aligned state may be employed.

(4) In the above embodiments, the positioning groove 6 has a recessed shape to position the clamping band 2 with respect to the axial direction. However, alternatively, a configuration may also be employed in which a pair of protrusions are formed in a protruding manner so as to be spaced apart from each other, and the clamping band 2 is arranged between these protrusions.

(5) In Embodiments 3, 6, and 9, the body-side locking-receiving portion 35 is formed in the clip 34, and the magnetic core 1 is indirectly locked to the body 31 via the clip 34. However, a configuration may also be employed in which a locking-receiving portion is formed in the body 31 itself so that the magnetic core 1 is directly locked to this locking-receiving portion.

(6) In the above embodiments, the tape T is wound around the electric wire fixing portions and the harness fixing portions together with the electric wire 3 and the wire harness 21, respectively. However, alternatively, the electric wire fixing portions and the harness fixing portion may also be fixed by the clamping band 2.

(7) In Embodiments 4 to 6, the upper and lower holders 40A and 40B are integrated via the hinge 41. However, a configuration may also be employed in which the hinge 41 is not provided, and the upper and lower holders 40A and 40B are two separate members.

(8) Although the magnetic core has a cylindrical shape in the above embodiments, the magnetic core may also have a tubular shape that is not circular.

(9) Although the cross-sectional shape of the electric wire insertion hole is a circular shape in the above embodiments, the cross-sectional shape of the electric wire insertion hole may also be a non-circular shape.

(10) Although the number of electric wire insertion holes formed in one magnetic core is one in the above embodiments, a plurality of electric wire insertion holes may also be formed in one magnetic core.

(11) Although a positioning groove is formed in the outer circumference of the ferrite core (magnetic core) in the above embodiments, a mode may also be employed in which a positioning groove is not formed in the outer circumference of the ferrite core (magnetic core).

(12) Although the core sections are tightened (fixed in a combined state) by one clamping band in the above embodiments, the number of clamping bands for tightening the core sections may also be two or more, in accordance with the weight or size of the magnetic core.

(13) The holder-side locking-receiving portion may also be provided in Embodiments 3 and 6.

(14) In Embodiments 10 to 18, the relation between the magnetic core, the clamping band, and the holder regarding whose heat conductivity is higher or lower, can be changed in any manner. For example, the heat conductivity of the magnetic core may also be the same as the heat conductivity of the clamping band, or the heat conductivity of the clamping band may also be the same as the heat conductivity of the holder.

(15) In Embodiments 10 to 18, the relation between the magnetic core, the clamping band, the body, and the clip regarding whose heat conductivity is higher or lower, can be changed in any manner. For example, the heat conductivity of the body and the clip may also be the same as the heat conductivity of the magnetic core and the clamping band, or the heat conductivity of the clip may also differ from the heat conductivity of the body.

(16) Although Embodiments 15 and 18 employs a configuration in which the heat-releasing member is the body, the present invention is not limited thereto. For example, a metallic case having a relatively large heat-releasing area, such as an ECU case (metallic case made of aluminum or the like) may also be used.

The invention claimed is:

1. A magnetic core fixing structure for forming a tubular magnetic core having an insertion hole through which an electric conductor is passed along an axis, the magnetic core having a plurality of core sections, which are divided in a circumferential direction, aligned with each other, the magnetic core fixing structure comprising:
   a binding member that has a flexible band shape, and is wound, in the circumferential direction, around outer circumferential faces of the core sections to bind the core sections together,
   wherein one end portion of the binding member serves as a lock portion for maintaining a bound state between the divided cores,
   in a state where the divided cores are bound together, a portion of the other end portion of the binding member that has passed through the lock portion serves as a remaining portion, and
   the magnetic core is locked with the remaining portion to a locking-receiving portion that is provided in an enclosure capable of being fixed to a fixing member and the enclosure is fixed to the electric conductor.

2. The magnetic core fixing structure according to claim 1,
   wherein the enclosure is fixed to a wire harness, which serves as the fixing member and is arranged in a region near the electric conductor.

3. The magnetic core fixing structure according to claim 1,
   wherein the enclosure includes a core attaching portion that has the locking-receiving portion and exposes substantially the entire magnetic core, and electric conductor fixing portions that extend from both end portions of the core attaching portion in a direction in which the electric conductor extends, the electric conductor fixing portions being fixed to the electric conductor.

4. The magnetic core fixing structure according to claim 2,
   wherein the enclosure has the locking-receiving portion and includes a core attaching portion that exposes substantially the entire magnetic core, and harness fixing portions that extend from both end portions of the attaching portion in a direction in which the wire harness extends, the harness fixing portions being fixed to the wire harness.

5. The magnetic core fixing structure according to claim 1,
   wherein the enclosure has the locking-receiving portion and has a case shape that substantially matches an outer circumferential shape of the magnetic core, accommodates substantially half of the circumference thereof, and exposes the remaining, substantially half of the circumference thereof, the enclosure being provided with:
   a core accommodating portion in which a pair of pressing walls are formed at both ends in an axial direction that oppose respective end faces, in the axial direction, of the magnetic core and position the magnetic core relative to the axial direction, and
   electric conductor fixing portions that extend from both end portions of the core accommodating portion in an axial direction of the electric conductor and are fixed to the electric conductor.

6. The magnetic core fixing structure according to claim 2,
   wherein the enclosure has the locking-receiving portion and has a case shape that substantially matches an outer circumferential shape of the magnetic core, accommodates substantially half of the circumference thereof, and exposes the remaining, substantially half of the circumference thereof, the enclosure being provided with:
   a core accommodating portion in which a pair of pressing walls are formed at both ends in an axial direction that oppose respective end faces, in the axial direction, of the magnetic core and position the magnetic core relative to the axial direction, and
   harness fixing portions that extend from both end portions of the core accommodating portion in an axial direction of the wire harness and are fixed to the wire harness.

7. The magnetic core fixing structure according to claim 1,
   wherein the enclosure has the locking-receiving portion and has a case shape that accommodates the entire magnetic core in a hidden state using a pair of openable and closable half-divided bodies that substantially match an outer circumferential shape of the magnetic core and are divided in a radial direction, the enclosure being provided with:
   a core accommodating portion having a pair of pressing walls that are formed in the half-divided bodies and oppose respective end faces, in the axial direction, of the magnetic core and position the magnetic core relative to the axial direction, and
   electric conductor fixing portions that extend from both end portions of the core accommodating portion in an axial direction of the electric conductor and are fixed to the electric conductor.

8. The magnetic core fixing structure according to claim 2,
   wherein the enclosure has the locking-receiving portion and has a case shape that accommodates the entire magnetic core in a hidden state using a pair of openable and closable half-divided bodies that substantially match an outer circumferential shape of the magnetic core and are divided in a radial direction, the enclosure being provided with:
   a core accommodating portion having a pair of pressing walls that are formed in the half-divided bodies and oppose respective end faces, in the axial direction, of the magnetic core and position the magnetic core relative to the axial direction, and
   harness fixing portions that extend from both end portions of the core accommodating portion in an axial direction of the wire harness and are fixed to the wire harness.

9. The magnetic core fixing structure according to claim 1,
   wherein a positioning portion for positioning the binding member relative to an axial direction of the magnetic core is formed in an outer circumferential face of the magnetic core.

10. The magnetic core fixing structure according to claim 1, wherein the binding member is made of a material having a higher heat conductivity than that of the magnetic core, and the enclosure is connected to a heat-releasing member, or the remaining portion is connected to the heat-releasing member via a heat-transmitting member.

* * * * *